(12) United States Patent  
Hofmann et al.

(10) Patent No.: US 7,772,580 B2
(45) Date of Patent: Aug. 10, 2010

(54) INTEGRATED CIRCUIT HAVING A CELL WITH A RESISTIVITY CHANGING LAYER

(75) Inventors: Franz Hofmann, Munich (DE); Josef Willer, Riemerling (DE)

(73) Assignee: Qimonda AG, Munich (DE)

( * ) Notice: Subject to any disclaimer, the term of this patent is extended or adjusted under 35 U.S.C. 154(b) by 85 days.

(21) Appl. No.: 11/837,380

(22) Filed: Aug. 10, 2007

(65) Prior Publication Data

US 2009/0039329 A1    Feb. 12, 2009

(51) Int. Cl.
*H01L 29/02* (2006.01)
(52) U.S. Cl. .............. 257/2; 257/3; 257/4; 257/5; 257/489; 257/536; 257/537; 257/E29.002; 257/E29.141
(58) Field of Classification Search .............. 257/2–5, 257/489, 536, 537, E29.002, E29.141
See application file for complete search history.

(56) References Cited

U.S. PATENT DOCUMENTS

| 6,731,544 | B2 | 5/2004 | Han et al. |
| 6,759,267 | B2 | 7/2004 | Chen |
| 6,903,361 | B2 | 6/2005 | Gilton |
| 7,336,556 | B2 | 2/2008 | Okayama et al. |
| 7,538,411 | B2 * | 5/2009 | Willer et al. ............ 257/536 |
| 7,599,211 | B2 * | 10/2009 | Blanchard ............ 365/148 |
| 2003/0117861 | A1 | 6/2003 | Maayan et al. |
| 2005/0174861 | A1 | 8/2005 | Kim et al. |
| 2005/0207263 | A1 | 9/2005 | Okayama et al. |
| 2006/0113614 | A1 | 6/2006 | Yoo et al. |
| 2006/0152961 | A1 | 7/2006 | Kim et al. |
| 2006/0258079 | A1 | 11/2006 | Lung et al. |
| 2007/0254428 | A1 | 11/2007 | Willer et al. |
| 2008/0247215 | A1 * | 10/2008 | Ufert ............ 365/148 |
| 2008/0273369 | A1 * | 11/2008 | Angerbauer et al. ...... 365/148 |

FOREIGN PATENT DOCUMENTS

| DE | 10 2006 020 179 A1 | 11/2007 |
| EP | 1 542 284 A1 | 6/2005 |
| EP | 1 768 187 A1 | 3/2007 |

* cited by examiner

*Primary Examiner*—Andy Huynh

(57) ABSTRACT

In an embodiment of the invention, an integrated circuit having a cell is provided. The cell may include a field effect transistor structure which includes a gate stack and a resistivity changing material structure disposed above the gate stack, wherein the resistivity changing material structure includes a resistivity changing material which is configured to change its resistivity in response to the application of an electrical voltage to the resistivity changing material structure.

30 Claims, 18 Drawing Sheets

INTEGRATED CIRCUIT HAVING A CELL WITH A RESISTIVITY CHANGING LAYER

TECHNICAL FIELD

Embodiments of the invention relate generally to integrated circuits having a cell and to methods for manufacturing an integrated circuit having a cell.

BACKGROUND

With a continuous desire for a small cell layout and further scalability, various implementation requirements rise with regard to reliability as well as to its manufacture.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

As used herein the terms connected and coupled are intended to include both direct and indirect connection and coupling, respectively.

Figure 1:
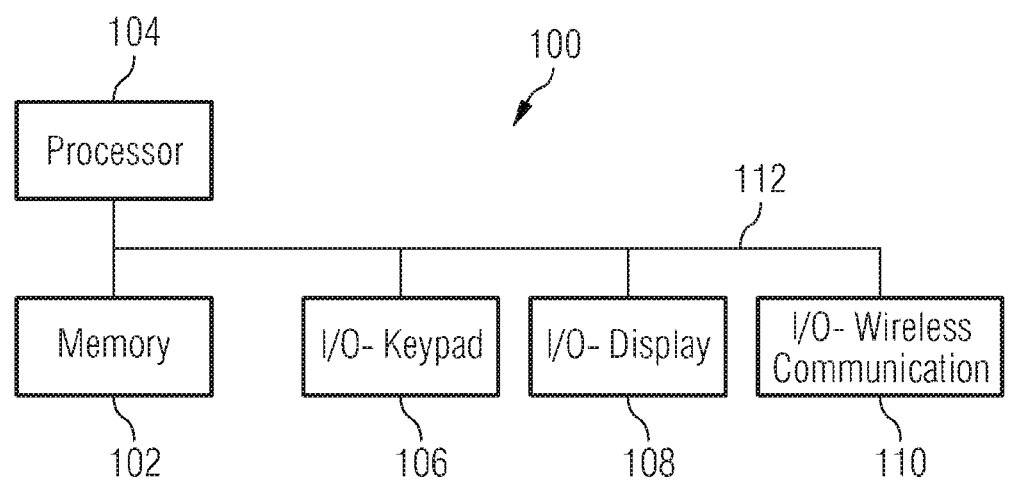
FIG. 1 shows a computing system that uses a memory device in accordance with embodiments of the invention.

FIG. 1 shows an example computing system 100 that uses a memory device constructed of memory cells in accordance with embodiments of the invention which will be described in more detail below. The computing system 100 includes a memory device 102, which may utilize memory cells having memory cells in accordance with embodiments of the invention. The computing system 100 also includes a processor 104, and one or more input/output devices, such as a keypad 106, display 108, and wireless communication device 110. The memory device 102, processor 104, keypad 106, display 108 and wireless communication device 110 may be interconnected by a bus 112. The computing system 100 may be a general purpose computer such as, e.g., a personal computer or a workstation. In an embodiment of the invention, the computing system 100 may be a digital still camera, a video recorder (such as, e.g., a video tape recorder or a DVD recorder), a mobile radio communication device such as, e.g., a cellular phone, a car control device, etc. In general, the computing system 100 may be any kind of computing device that includes a processor (which may be implemented as hard-wired logic or as a programmable processor such as, e.g., a microprocessor) and memory cells which will be described in more detail below.

The wireless communication device 110 may include circuitry (not shown) for sending and receiving transmissions over a cellular telephone network, a WiFi wireless network, or other wireless communication network. It will be understood that the variety of input/output devices shown in FIG. 1 is merely an example, in which the computing system 100 may be configured as a cellular telephone or other wireless communication device. Memory devices including memory cells in accordance with embodiments of the invention may be used in a wide variety of systems. Alternative system designs may include different input/output devices, multiple processors, alternative bus configurations, and many other configurations.

The computing system 100 may further include a power supply circuit (not shown) and a removable non-volatile memory device such as, e.g., a small form factor card.

The memory cells in accordance with various embodiments of the invention may include volatile memory cells and/or non-volatile memory cells. The memory cells in accordance with various embodiments of the invention may further include "multi-bit" memory cells and/or "multi-level" memory cells.

A "non-volatile memory cell" may be understood as a memory cell storing data even if it is not active. In an embodiment of the invention, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months.

As used herein the term "multi-bit" memory cell is intended to, e.g., include memory cells which are configured to store a plurality of bits by spatially separated electric charge storing regions, thereby representing a plurality of logic states.

Furthermore, as used herein the term "multi-level" memory cell is intended to include memory cells which are configured to store a plurality of bits or data, e.g., by showing distinguishable threshold voltages dependent on the amount of electric charge stored in the memory cell, thereby representing a plurality of logic states.

In an embodiment of the invention, the cell may be a logic cell being used in a logic cell arrangement such as a processor, e.g., a hard-wired logic cell arrangement or a programmable processor (e.g., a microprocessor, which may include a complex instruction set computer (CISC) processor, a reduced instruction set computer (RISC) processor, or any other computer or processor architecture capable of executing programmed instructions).

In an embodiment of the invention, the cell may be a memory cell, e.g., an electrically writable and erasable non-volatile memory including a resistivity changing layer, as will be described in more detail below.

Figure 2:
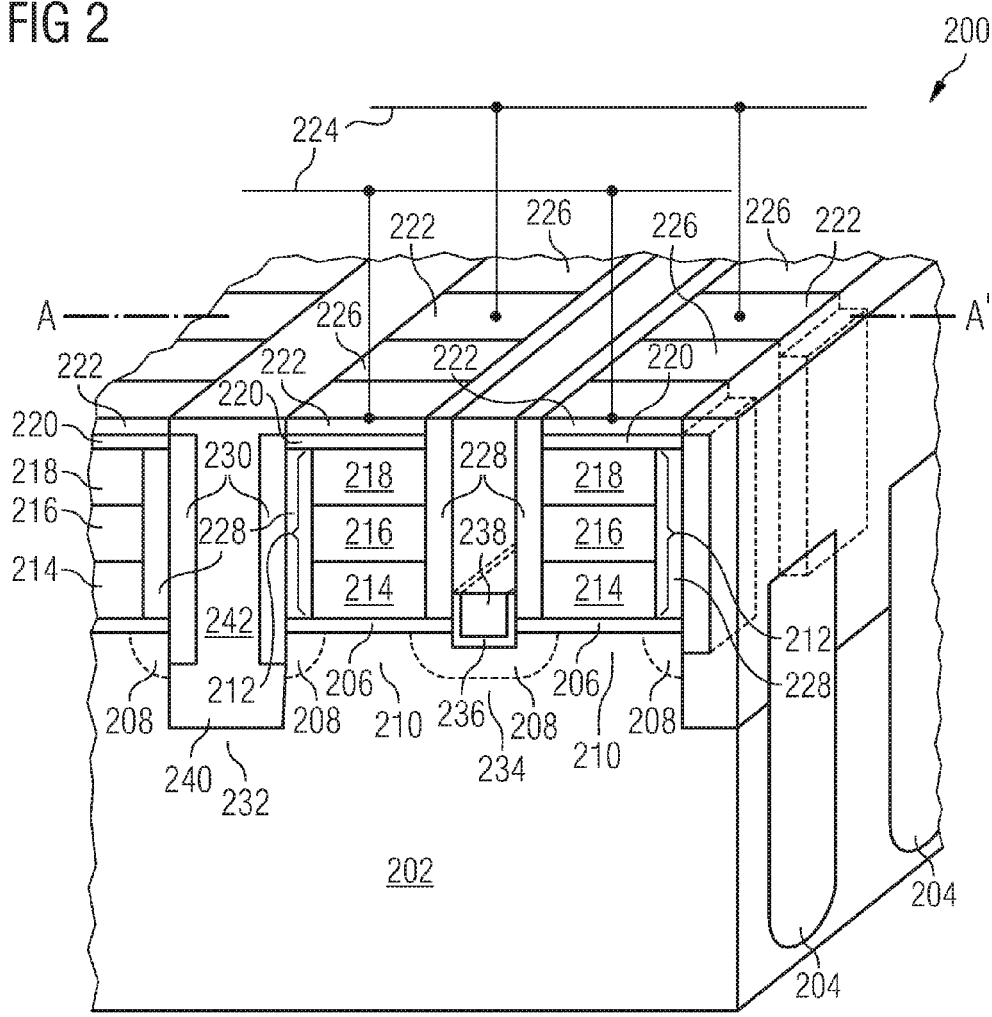
FIG. 2 shows a perspective view illustrating a cell arrangement in accordance with an embodiment of the invention.

FIG. 2 shows a perspective view illustrating a cell arrangement 200 in accordance with an embodiment of the invention.

In an embodiment of the invention, the cell arrangement 200 (which may be implemented in an integrated circuit), e.g., a memory cell arrangement 200, includes a substrate 202. In an embodiment of the invention, the substrate (e.g., a wafer substrate) 202 may be made of semiconductor materials of various types, including silicon, germanium, Group III to V or other types, including polymers, for example, although in another embodiment of the invention, other suitable materials can also be used. In an exemplary embodiment of the invention, the wafer substrate 202 is made of silicon (doped or undoped), in an alternative embodiment of the invention, the wafer substrate 202 is a silicon on insulator (SOI) wafer. As an alternative, any other suitable semiconductor materials can be used for the wafer substrate 202, for example, semiconductor compound material such as gallium arsenide (GaAs), indium phosphide (InP), but also any suitable ternary semiconductor compound material or quaternary semiconductor compound material such as indium gallium arsenide (InGaAs).

As shown in FIG. 2, shallow trench isolations 204 (e.g., trenches filled with an insulating material such as an oxide, e.g., silicon oxide) are provided in the substrate 202. In an embodiment of the invention, the shallow trench isolations 204 are arranged parallel to one another and at a distance from one another. The shallow trench isolations 204 extend in a first direction. In an embodiment of the invention, the shallow trench isolations 204 are provided to electrically separate active areas of the cell arrangement 200 from one another. In an embodiment of the invention, a dielectric layer 206 such as, e.g., a gate dielectric layer (e.g., made of an oxide, e.g., made of silicon oxide), is provided on the upper surface of the substrate 202. Furthermore, diffusion regions 208 are provided in the substrate 202 which, inter alia, may form portions of source/drain regions to be formed. An active region 210 is provided between respective two diffusion regions 208. The active region 210 may be rendered electrically conductive (in other words form a conductive channel) in response to an appropriate voltage application to a gate region (which will be described in more detail below) and to the respective two diffusion regions 208. In an embodiment of the invention, the diffusion regions 208 are n-doped regions (in case that the cells are formed as an n-type transistor) or p-doped regions (in case that the cells are formed as a p-type transistor).

In the embodiment shown in FIG. 2, the cell arrangement 200 includes a plurality of cells, wherein each cell includes at least one transistor. In an embodiment of the invention, the memory cell arrangement 200 includes a plurality of memory cells, wherein each memory cell includes at least one memory transistor, which will be described in more detail below. The cells are coupled with each other in accordance with a NOR architecture. However, the cells may be coupled with each other in accordance with any other suitable architecture in an alternative embodiment of the invention.

As shown in FIG. 2, gate stacks 212 are disposed above the substrate 202, wherein the gate stacks 212 include portions of the dielectric layer 206, which are arranged on the active regions 210. In an embodiment of the invention, each gate stack 212 includes a first electrically conductive layer 214 (e.g., made of polysilicon or any other suitable electrically conductive material), an optional diffusion barrier layer (not shown) on the electrically conductive layer 214, a second electrically conductive layer 216 (e.g., made of a metal such as, e.g., tungsten (W)) on the diffusion barrier layer (or, in case no diffusion barrier layer is provided, on the first electrically conductive layer 214) and a second dielectric layer 218 (e.g., made of a nitride, e.g., made of silicon nitride) on the second electrically conductive layer 216. In an embodiment of the invention, the second electrically conductive layer 216 forms a portion of a respective word line, the memory cell is coupled with, as will be described in more detail below.

Furthermore, a resistivity changing layer structure 220 is provided on or above each of the gate stacks 212. Each resistivity changing layer structure may include one layer or a plurality of layers. In an embodiment of the invention, the resistivity changing layer structure includes a resistivity changing layer 222, wherein the resistivity changing layer 222 comprises a resistivity changing material. The resistivity changing material may be a transition metal oxide (e.g., a binary transition metal oxide), a solid state electrolyte, an organic material such as, e.g., a polymer or another material that can be switched between states of different resistivities and thus of different electrical resistances by means of an applied electric field or an applied temperature.

In an embodiment of the invention, the resistivity changing material may include phase change material that may be used in a phase change memory cell. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is also referred to as a "crystalline state", whereas the crystallization state having a low degree of crystallization is also referred to as an "amorphous state". Different crystallization states can be distinguished from each other by their differing electrical properties, and in particular by their different resistances. By way of example, a crystallization state having a high degree of crystallization (ordered atomic structure) generally has a lower resistance than a crystallization state having a low degree of crystallization (disordered atomic structure). For sake of simplicity, it will be assumed in the following that the phase changing material can adopt two crystallization states (an "amorphous state" and a "crystalline state"), however it will be understood that additional intermediate states or different crystalline phases such as bcc, hcp or fcc with different resistivities may also be used.

A phase changing memory cell having a phase changing material may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory element, a sensing current may be routed through the phase changing material (or a sensing voltage may be applied across the phase changing material), thereby sensing the resistivity of the resistivity changing memory element, which represents the memory state of the memory element.

To set the phase changing material to the crystalline state, a current pulse and/or voltage pulse may be applied to the phase changing material, wherein the pulse parameters are chosen such that the phase changing material is heated above its crystallization temperature, while keeping the temperature below the melting temperature of the phase changing material. To set the phase changing material to the amorphous state, a current pulse and/or voltage pulse may be applied to the phase changing material, wherein the pulse parameters are chosen such that the phase changing material is quickly heated above its melting temperature, and is quickly cooled.

The phase changing material may include a variety of materials. According to one embodiment, the phase changing material may include or consist of a chalcogenide alloy that includes one or more elements from group VI of the periodic table. According to another embodiment, the phase changing material may include or consist of a chalcogenide compound material, such as GeSbTe, SbTe, GeTe or AgInSbTe. According to a further embodiment, the phase changing material may include or consist of chalcogen free material, such as GeSb, GaSb, InSb, or GeGaInSb. According to still another embodiment, the phase changing material may include or consist of any suitable material including one or more of the elements Ge, Sb, Te, Ga, Bi, Pb, Sn, Si, P, O, As, In, Se, and S.

According to one embodiment, at least one of the at least one electrode which may be provided in this case may include or consist of Ti, V, Cr, Zr, Nb, Mo, Hf, Ta, W, or mixtures or alloys thereof. According to another embodiment, at least one of the at least one electrode may include or consist of Ti, V, Cr, Zr, Nb, Mo, Hf, Ta, W and two or more elements selected from the group consisting of B, C, N, O, Al, Si, P, S, and/or mixtures and alloys thereof. Examples of such materials include TiCN, TiAlN, TiSiN, W—$Al_2O_3$ and Cr—$Al_2O_3$.

In an embodiment of the invention, the phase changing material may be changed from the amorphous state to the crystalline state (or vice versa) under the influence of a temperature change. More generally, the phase changing material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, a sense amplifier is capable of determining the memory state of a phase changing memory cell using the phase changing material in dependence on the resistance of the phase changing material.

To achieve high memory densities, in an embodiment of the invention, a phase changing memory cell may be capable of storing multiple bits of data, i.e., the phase changing material may be programmed to more than two resistance values. For example, if a phase changing memory cell is programmed to one of three possible resistance levels, 1.5 bits of data per memory element can be stored. If the phase changing memory element is programmed to one of four possible resistance levels, two bits of data per memory element can be stored, and so on.

In another embodiment of the invention, the resistivity changing layer structure may include a programmable metallization cell (PMCs) structure, a magento-resistive memory cell structure (e.g., MRAMs) or an organic memory cell structure (e.g., ORAMs).

In an embodiment of the invention, in which the resistivity changing layer structure 220 may include a programmable metallization cell (PMCs) structure (which may also be referred to as a conductive bridging random access memory (CBRAM) structure, the resistivity changing layer structure may include a solid state electrolyte as the resistivity changing layer 222, e.g., made of a chalcogenide. In the context of this description chalcogenide material may be understood, for example, as any compound containing sulfur, selenium, germanium and/or tellurium. In accordance with one embodiment of the invention the ion conducting material is, for example, a compound, which is made of a chalcogenide and at least one metal of the group I or group II of the periodic system, for example, arsene-trisulfide-silver. Alternatively, the chalcogenide material contains germanium-sulfide (GeS), germanium-selenide (GeSe), tungsten oxide ($WO_x$), copper sulfide (CuS) or the like. Furthermore, the chalcogenide material may contain metal ions, wherein the metal ions can be made of a metal, which is selected from a group consisting of silver, copper and zinc or of a combination or an alloy of these metals.

Another type of resistivity changing layer structure may be formed using carbon as a resistivity changing material. Generally, amorphous carbon that is rich is $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing layer structure being part of a resistivity changing memory cell.

In one embodiment, a carbon resistivity changing memory cell may be formed in a manner similar to that described above with reference to phase changing memory cell. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

Generally, in this type of carbon resistivity changing memory cell, application of a first temperature causes a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon.

In an embodiment of the invention, the resistivity changing memory cell (and thus the resistivity changing layer structure 220 in this case) may include a top contact (e.g., a top electrode), a carbon storage layer including an insulating amorphous carbon material rich in $sp^3$ hybridized carbon atoms, and a bottom contact (e.g., a bottom electrode). By forcing a current (or voltage) through the carbon storage layer, an $sp^2$ filament can be formed in the $sp^3$-rich carbon storage layer, changing the resistivity of the resistivity changing memory cell. Application of a current (or voltage) pulse with higher energy (or, in some embodiments, reversed polarity) may destroy the $sp^2$ filament, increasing the resistance of the carbon resistivity changing layer. As discussed above, these changes in the resistance of the carbon resistivity changing layer can be used to store information, with, for example, a high resistance state representing a "0" and a low resistance state representing a "1". Additionally, in some embodiments, intermediate degrees of filament formation or formation of multiple filaments in the $sp^3$-rich carbon film may be used to provide multiple varying resistivity levels, which may be used to represent multiple bits of information in a carbon memory element. In some embodiments, alternating layers of $sp^3$-rich carbon and $sp^2$-rich carbon may be used to enhance the formation of conductive filaments through the $sp^3$-rich layers, reducing the current and/or voltage that may be used to write a value to this type of carbon memory.

In another embodiment of the invention, the resistivity changing memory cell (and thus the resistivity changing layer structure 220 in this case) may include molecular memory films.

In yet another embodiment of the invention, the resistivity changing memory cell (and thus the resistivity changing layer structure 220 in this case) may include polymer memories and/or extremely thin films of the so-called Langmuir-Blodgett type.

In an embodiment of the invention, the resistivity changing layer structure 220 includes one electrode or a plurality of electrodes or one or more other functional layers, e.g., one or more layers of a material that may be diffused into the resistivity changing layer 220. In an embodiment of the invention, the one electrode or the plurality of electrodes or the one or more other functional layers may be made of a metal such as, e.g., silver (Ag), copper (Cu) or tungsten (W) or a combination or an alloy of these materials.

In an embodiment of the invention, a first resistivity changing layer structure layer 220 (e.g., made of polysilicon or another electrically conductive material such as, e.g., a metal, e.g., one of the metals previously described) is provided on or above the second dielectric layer 218. Moreover, a resistivity changing layer 222 may be provided on or above the first resistivity changing layer structure layer 220. The resistivity changing layer 222 may be made of a transition metal oxide or a solid state electrolyte or any other suitable material, for example, a material as described above.

Patterned bit lines 224 are provided on or above the resistivity changing layer 222 and are electrically coupled thereto (directly or via e.g. an electrode). The bit lines 224 are electrically isolated from each other by means of insulating material 226 such as, e.g., an oxide (e.g., silicon oxide) or a nitride (e.g., silicon nitride). In an embodiment of the invention, the insulating material 226 is boron phosphorous silicate glass (BPSG).

In an embodiment of the invention, an electrically insulating spacer structure 228 (e.g., made of a nitride, e.g., made of silicon nitride) is provided adjacent to the gate stacks and surrounding the gate stacks.

Furthermore, a source line contact region 232 is provided on one side of each gate stack and a source/drain region 234 is provided on the opposite side of a respective gate stack such that respective two adjacent gate stacks share a common source line contact region 232 and source/drain region 234, respectively.

In an embodiment of the invention, the source/drain region 234 is provided with a highly electrically conductive material 238 such as, e.g., polysilicon or a metal (e.g., tungsten (W) or CoSi). In an embodiment of the invention, a barrier layer 236 may be provided between the portion of the diffusion region 208 being heavily doped and the highly electrically conductive material 238 such as, e.g., polysilicon or metal. The barrier layer may be made of titanium (Ti), or titanium nitride (TiN), for example. The trench structure, in which the source/drain region 234 is formed, may be filled with an insulating material such as, e.g., with a nitride (e.g., silicon nitride), as will be described in more detail below.

In an embodiment of the invention, source line contact region 232 includes an insulating region 240 (e.g., made of an oxide, e.g., silicon oxide) being arranged in a source line contact region trench, which may extend through the respective diffusion area 208 into the substrate 202 material. The bottom region of the source line contact region trench includes the insulating region 240 (e.g., made of an oxide, e.g., silicon oxide) up to a level that is above the substrate 202 and within the diffusion region 208, such that a portion of the diffusion region 208 is exposed above the insulating region 240. In other words, the upper surface of the insulating region 240 is arranged between the bottom surface and the upper surface of the diffusion region 208 and thus below the dielectric layer 206.

In an embodiment of the invention, an electrically conductive connecting structure 230 is provided next to the gate stack to electrically connect the resistivity changing layer with the diffusion region 208 (e.g., a source/drain region), wherein the electrically conductive connecting structure 230 (which may be provided in the form of at least one electrically conductive spacer) may be provided on the insulating region 240. The electrically conductive connecting structure 230 may be made of any suitable electrically conductive material such as, e.g., of polysilicon or of a metal (e.g., of a metal that may be deposited using a vapor deposition process, e.g., a chemical vapor deposition (CVD) process or a physical vapor deposition (PVD) process, e.g., tungsten silicide (WSi)).

In an embodiment of the invention, hollow space between the electrically conductive connecting structures 230 in the same source line contact region trench may be filled with insulating material 242 such as an oxide (e.g., silicon oxide).

In an embodiment of the invention, the resistivity changing layer structure 220 is a planar layer structure which may easily be deposited and patterned in the same manner as the gate stack. Thus, a high density cell arrangement is provided. Furthermore, in accordance with an embodiment of the invention, due to the planar manufacturing of the resistivity changing layer structure, a high degree of flexibility with regard to the type of resistivity changing layer structure (e.g. one or more of the resistivity changing layer structures described above) can be achieved.

Figure 3:
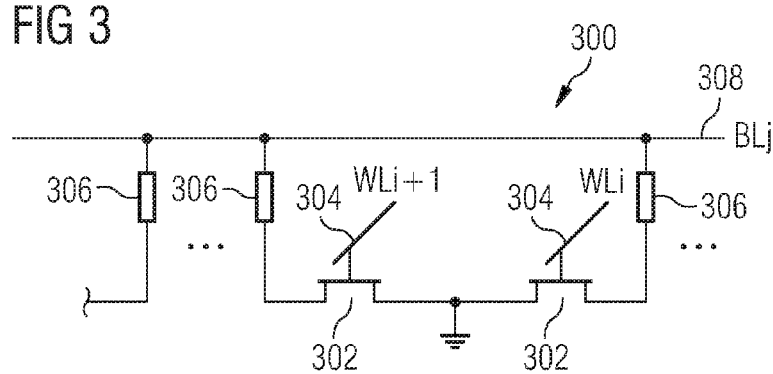
FIG. 3 shows an equivalent circuit of a cell arrangement in accordance with an embodiment of the invention.

FIG. 3 shows an equivalent circuit 300 of a cell arrangement in accordance with an embodiment of the invention.

As shown in FIG. 3, the equivalent circuit 300 includes a plurality of cells, wherein each cell includes a select transistor 302 (which may in an embodiment of the invention be formed by two diffusion regions 208, a portion of the dielectric layer 206, a respective active region 210, a respective first electrically conductive layer 214, a respective second electrically conductive layer 216, and a respective second dielectric layer 218), the gate of which may be connected to a word line WLi, WLi+1, . . . , 304. Furthermore, the equivalent circuit 300 may include the resistivity changing layer structure, in FIG. 3 symbolized by means of a resistor 306, a first terminal of which being connected to a bit line BLj 308, and a second terminal of which being connected to the drain of the select transistor 302. The sources of respectively two adjacent select transistors 302 are coupled with each other (thereby forming illustratively shared source regions) and with a reference potential 310 such as, e.g., the mass potential. An individual cell may be addressed by a selection of one bit line 308 and one word line 304.

It should be mentioned that in an embodiment of the invention, an arbitrary number of cells (e.g., memory cells) (e.g., hundreds, thousands, millions or billions, . . . ) may be provided as well as an arbitrary number of word lines and bit lines.

In the following, various embodiments of methods for manufacturing a cell arrangement will be described in more detail.

Figure 4:
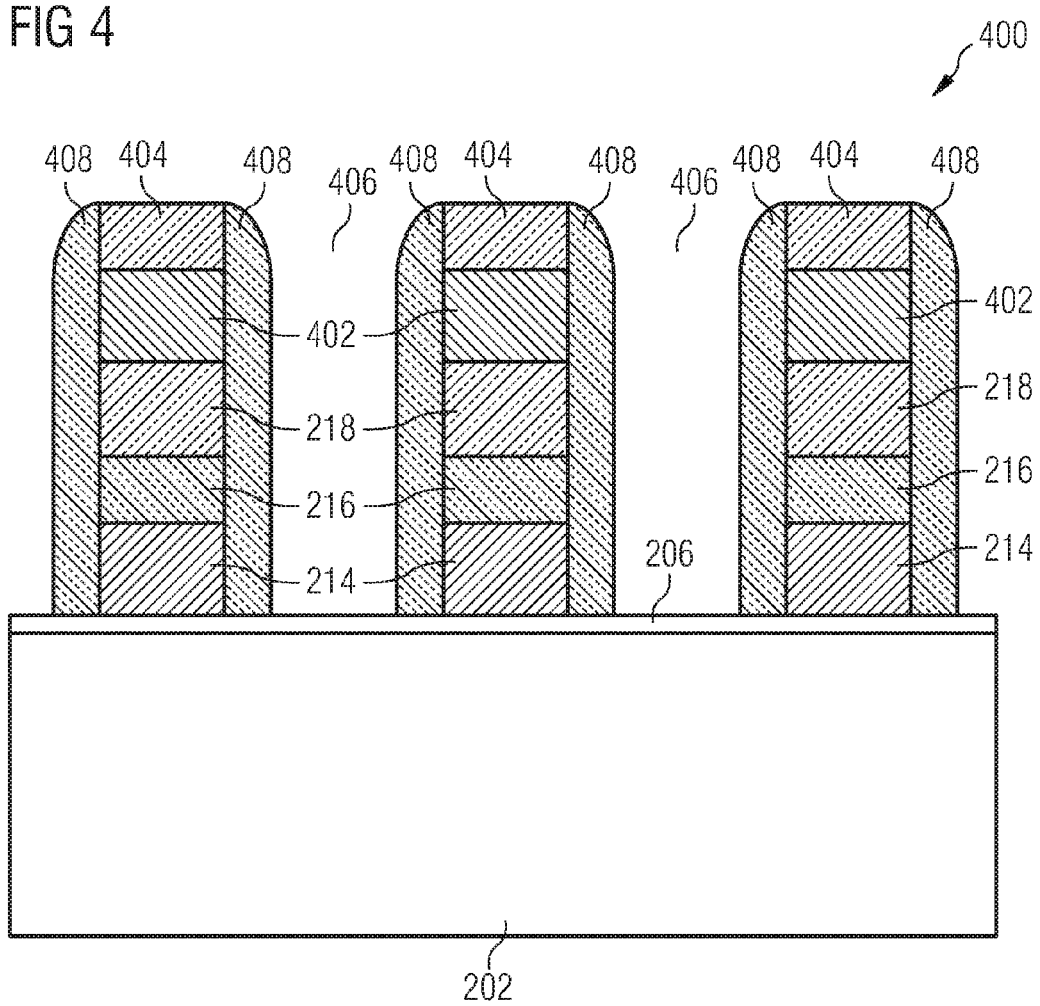
FIG. 4 shows a cross sectional view of the cell arrangement of FIG. 2 along the cross section A-A' in accordance with an embodiment of the invention at a first stage of its manufacture.

FIG. 4 shows a cross sectional view 400 of the cell arrangement of FIG. 2 along the cross section A-A' in accordance with an embodiment of the invention at a first stage of its manufacture.

As shown in FIG. 4, after having manufactured shallow trench isolations 204 in the substrate 202, the desired wells are provided using corresponding well implantation processes.

Then, the dielectric layer 206 is deposited. In an embodiment of the invention, a layer of an oxide, e.g., a layer of silicon oxide is deposited on the upper surface of the substrate 202 including the shallow trench isolations 204, using a vapor deposition process (e.g., a CVD process or a PVD process) or a thermal growing process. In an embodiment of the invention, the dielectric layer 206 is deposited with a layer thickness in the range from about 2 nm to about 20 nm, e.g., with a layer thickness in the range from about 4 nm to about 10 nm, e.g., with a layer thickness of about 5 nm.

Then, a layer of electrically conductive material is deposited (e.g., using a CVD process or a PVD process), which will, e.g., form the first electrically conductive layer 214 (e.g., made of polysilicon (doped or undoped) or any other suitable electrically conductive material). The layer of electrically conductive material may be deposited with a layer thickness in the range from about 20 nm to about 40 nm, e.g., with a layer thickness in the range from about 25 nm to about 35 nm, e.g., with a layer thickness of about 30 nm.

Next, optionally and depending on the material used in a subsequent deposition process, a combined ohmic contact and diffusion barrier layer may be deposited on the upper surface of the layer of electrically conductive material (e.g., using a CVD process or a PVD process). In an embodiment of the invention, the combined barrier layer may be made of titanium (Ti) which might at least partially react with Si or titanium nitride (TiN). In an embodiment of the invention, the barrier layer may include a plurality of layers, e.g., a first barrier layer (which may be made of titanium (Ti)) on the upper surface of the layer of electrically conductive material, and a second barrier layer (which may be made of titanium nitride (TiN)) on the upper surface of the first barrier layer. In an embodiment of the invention, the first barrier layer may be deposited with a layer thickness in the range from about 3 nm to about 7 nm, e.g., with a layer thickness in the range from about 4 nm to about 6 nm, e.g., with a layer thickness of about 5 nm. Furthermore, in an embodiment of the invention, the second barrier layer may be deposited with a layer thickness in the range from about 3 nm to about 10 nm, e.g., with a layer thickness in the range from about 5 nm to about 8 nm, e.g., with a layer thickness of about 7 nm. An alternative layer could be made of WN or TaN, for example.

In a following process, another layer of electrically conductive material is deposited (e.g., using a CVD process or a PVD process), which will, e.g., form the second electrically conductive layer 216 (e.g., made of tungsten (W) or any other suitable electrically conductive material). The further layer of electrically conductive material may be deposited with a layer thickness in the range from about 20 nm to about 40 nm, e.g., with a layer thickness in the range from about 25 nm to about 35 nm, e.g., with a layer thickness of about 30 nm. In an alternative embodiment of the invention, the further layer of electrically conductive material may include a plurality of layers of electrically conductive material, e.g., a plurality of metal layers.

After having deposited the further layer of electrically conductive material, in an embodiment of the invention, a layer of electrically insulating material is deposited (e.g., using a CVD process or a PVD process), which will, e.g., form the second dielectric layer 218 (e.g., made of a nitride, e.g., silicon nitride or any other suitable electrically insulating material). The layer of electrically insulating material may be deposited with a layer thickness in the range from about 20 nm to about 40 nm, e.g., with a layer thickness in the range from about 25 nm to about 35 nm, e.g., with a layer thickness of about 30 nm.

Then, a third layer 402 of electrically conductive material is deposited (e.g., using a CVD process or a PVD process), e.g., made of polysilicon (doped or undoped) or any other suitable electrically conductive material. The third layer 402 of electrically conductive material may be deposited with a layer thickness in the range from about 20 nm to about 40 nm, e.g., with a layer thickness in the range from about 25 nm to about 35 nm, e.g., with a layer thickness of about 30 nm.

Subsequently, a further dielectric layer 404 (e.g., made of a nitride, e.g., made of silicon nitride) is deposited (e.g., using a CVD process or a PVD process). The further dielectric layer 404 may be deposited with a layer thickness in the range from about 20 nm to about 40 nm, e.g., with a layer thickness in the range from about 25 nm to about 35 nm, e.g., with a layer thickness of about 30 nm.

Next, using a lithographic process and an etching process (e.g., an anisotropic etching process such as, e.g., a reactive ion etching (RIE) process) the regions are defined, in which the word lines should be formed in a later process. Then, the following layers are etched in accordance with the lithographic process and are thus patterned accordingly: the further dielectric layer 404 (e.g., the nitride layer), the third layer 402 of electrically conductive material (e.g., the layer made of polysilicon), the layer of electrically insulating material (e.g., the nitride layer), the other layer of electrically conductive material (e.g., the tungsten layer), if present, the barrier layer (s), and the layer of electrically conductive material (e.g., the polysilicon layer). The etching process is stopped on the upper surface of the dielectric layer 206, thereby forming first trenches 406.

Then, in an embodiment of the invention, another layer of insulating material (e.g., made of a nitride, e.g., made of silicon nitride or any other suitable electrically insulating material) is deposited (e.g., using a CVD process or a PVD process). Then, the other layer of insulating material is subjected to an anisotropic etching process (e.g., a RIE process) to form electrically insulating spacers (e.g., nitride spacers) 408 on the sidewalls of the gate stack structures formed in the previous processes in the first trenches 406. In an embodiment of the invention, the electrically insulating spacers are formed having a spacer thickness in the range from about 5 nm to about 15 nm, e.g., having a spacer thickness of about 10 nm.

Figure 5:
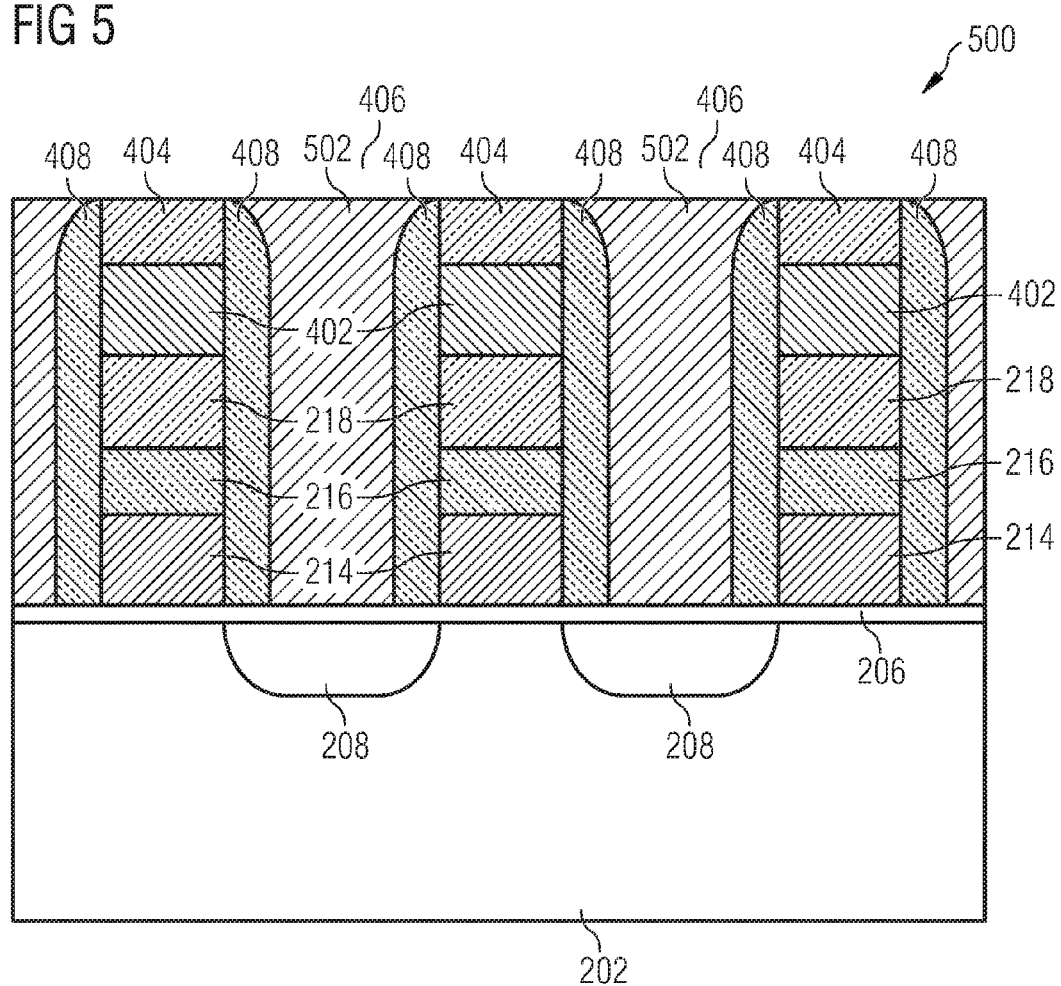
FIG. 5 shows a cross sectional view of the cell arrangement of FIG. 2 along the cross section A-A' in accordance with an embodiment of the invention at a second stage of its manufacture.

FIG. 5 shows a cross sectional view 500 of the cell arrangement of FIG. 2 along the cross section A-A' in accordance with an embodiment of the invention at a second stage of its manufacture.

Then, using an ion implantation process, the regions of the substrate 202 below the exposed portions of the dielectric layer 206 are implanted with doping atoms. In an embodiment of the invention, highly n-doped regions are formed that form the diffusion regions 208, e.g., by implanting n-type doping atoms such as, e.g., arsene (As) atoms. Then, using a CVD process or a PVD process, e.g., the first trenches 406 are filled and possibly overfilled with electrically conductive material 502, e.g., polysilicon (doped or undoped). In an embodiment of the invention, the trench overfilling electrically conductive material 502 is then removed, e.g., by means of a chemical mechanical polishing (CMP) process.

Figure 6:
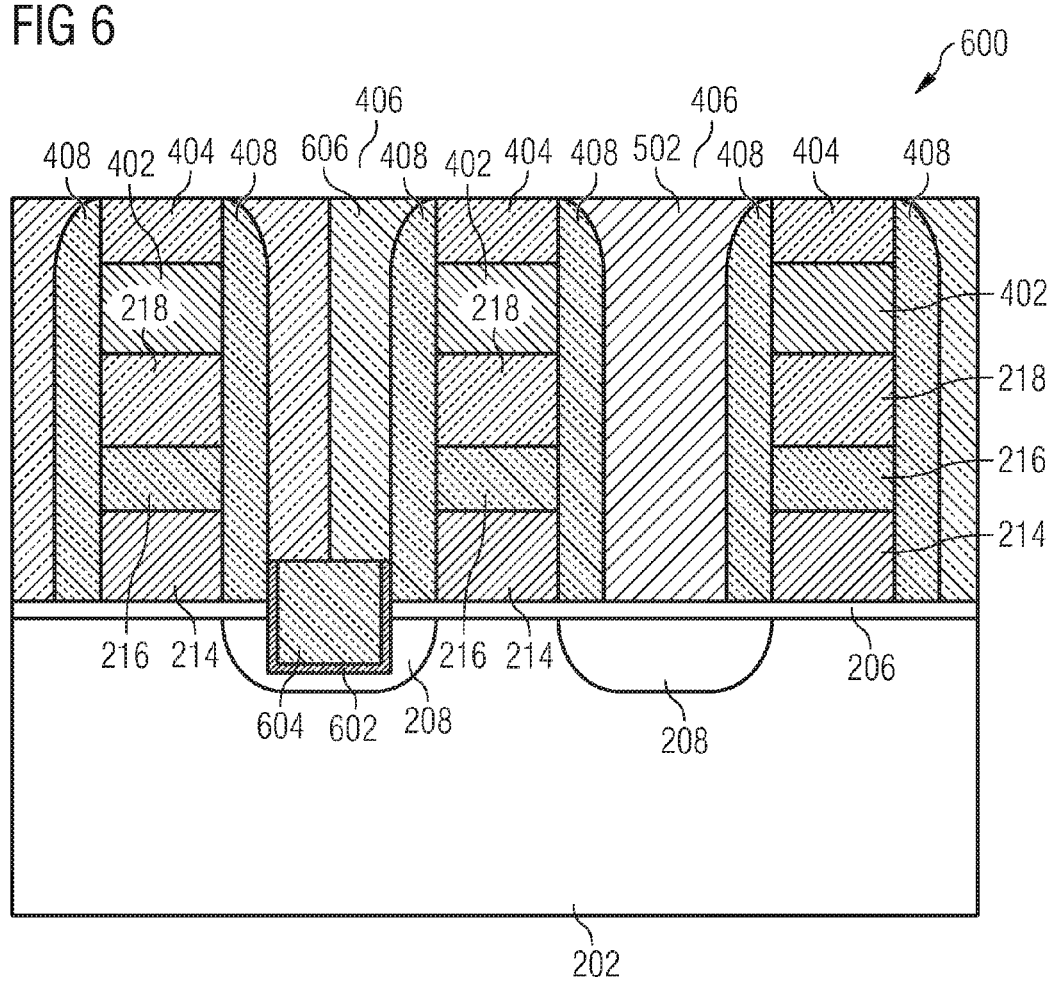
FIG. 6 shows a cross sectional view of the cell arrangement of FIG. 2 along the cross section A-A' in accordance with an embodiment of the invention at a third stage of its manufacture.

FIG. 6 shows a cross sectional view 600 of the cell arrangement of FIG. 2 along the cross section A-A' in accordance with an embodiment of the invention at a third stage of its manufacture.

Then, using a photolithographic process, the structure of a source/drain region within and above one of respective two diffusion regions 208 (in FIG. 6 the left diffusion region 208, in FIG. 2 the diffusion region 208 on the right hand side) of a respective gate stack 212 is defined using a photoresist mask and or an auxiliary mask (such as, e.g., a hardmask e.g., made of silicon oxide, silicon nitride or carbon). After having exposed the regions above the diffusion region 208, in which or above which the source/drain region should be formed, as shown in FIG. 6, the electrically conductive material 502 in the left first trench 406 of FIG. 6 is removed (e.g., etched, e.g., using a dry etching or wet etching process, e.g., using an anisotropic etching such as, e.g., a RIE process). Furthermore, the then exposed portion of the dielectric layer 206 within the left first trench 406 (in the following also referred to as source/drain trench 406), portions of the substrate 202 material (e.g., silicon) and portions of the shallow trench isolations 204 below the removed dielectric layer 206 are also removed (e.g., using the same process that is used to remove the electrically conductive material 502 in the source/drain trench 406).

In an embodiment of the invention, a barrier layer 602 may be provided (e.g., deposited, e.g., using a CVD process or a PVD process) on the exposed portions (on the sidewalls and the bottom) of the source/drain trench 406 and thus partially in the exposed and partially removed diffusion region 208. The barrier layer 602 may be made of titanium (Ti), or titanium nitride (TiN), for example. In an embodiment of the invention, the barrier layer 602 may include a plurality of layers, e.g., a first barrier layer (which may be made of titanium (Ti)) on the upper surface of the layer of electrically conductive material, and a second barrier layer (which may be made of titanium nitride (TiN)) on the upper surface of the first barrier layer. In an embodiment of the invention, the first barrier layer may be deposited with a layer thickness in the range from about 3 nm to about 7 nm, e.g., with a layer thickness in the range from about 4 nm to about 6 nm, e.g., with a layer thickness of about 5 nm. Furthermore, in an embodiment of the invention, the second barrier layer may be deposited with a layer thickness in the range from about 3 nm to about 10 nm, e.g., with a layer thickness in the range from about 5 nm to about 8 nm, e.g., with a layer thickness of about 7 nm.

Then, electrically conductive material such as, e.g., a metal (e.g., tungsten) or polysilicon is deposited (e.g., using a PVD process or a growth process) and then partially removed (e.g., etched back) to form an electrically conductive source/drain layer 604, which extends substantially in parallel with the word lines and which is separated by means of the remaining shallow trench isolations 204. Alternatively in the case of polysilicon, the heavily doped semi-conductive material can be deposited directly on the source/drain structure without an ohmic contact/barrier layer. In addition, this poly layer can be shunted by CoSi metal layer to reduce the sheet resistance. The electrically conductive source/drain layer 604 may have a layer thickness in the range from about 5 nm to about 40 nm, e.g., a layer thickness in the range from about 10 nm to about 20 nm, e.g., a layer thickness of about 15 nm.

Then, the source/drain trench 406 is filled and possibly overfilled with another electrically insulating material 606 (e.g., a nitride, e.g., silicon nitride), and the possibly trench overfilling electrically insulating material 606 may then be removed, e.g., using a CMP process.

Figure 7:
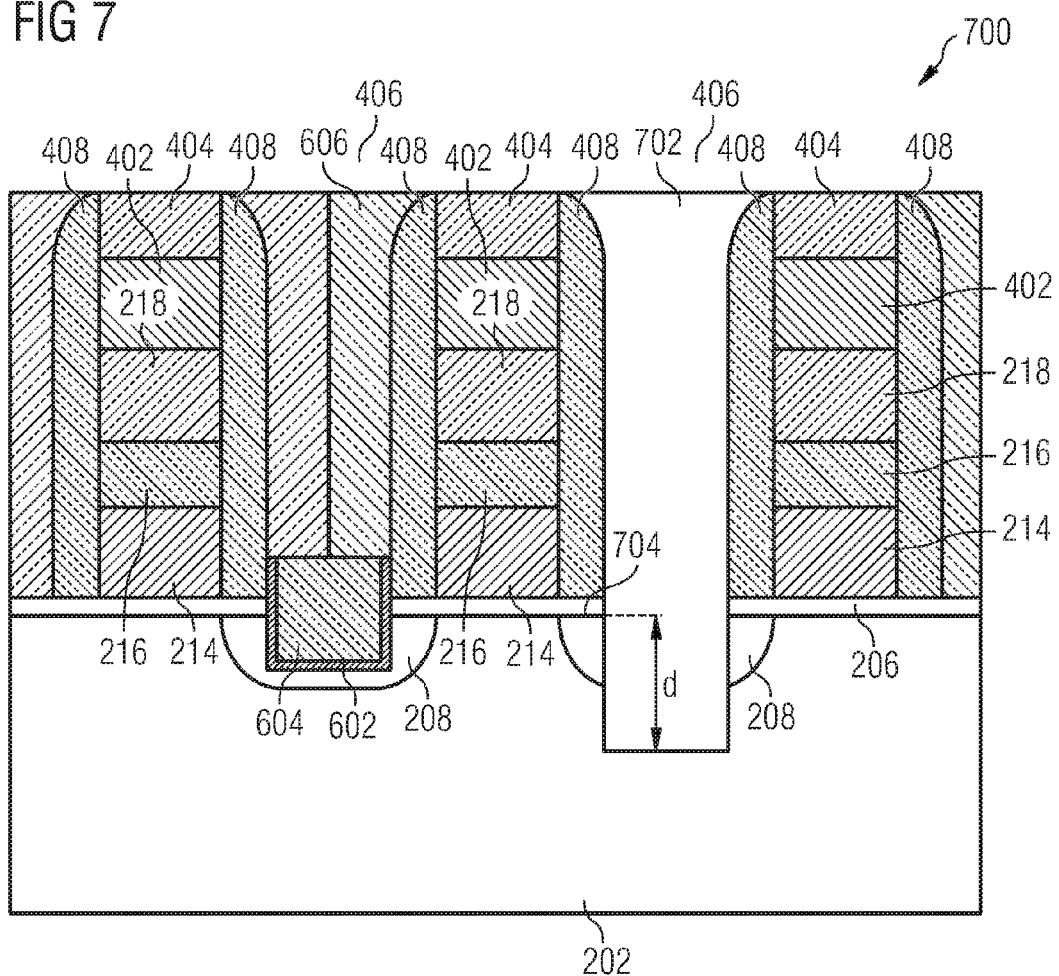
FIG. 7 shows a cross sectional view of the cell arrangement of FIG. 2 along the cross section A-A' in accordance with an embodiment of the invention at a fourth stage of its manufacture.

FIG. 7 shows a cross sectional view 700 of the cell arrangement of FIG. 2 along the cross section A-A' in accordance with an embodiment of the invention at a fourth stage of its manufacture.

Then, using a photolithographic process, the structure of a source contact within and above the other one of the respective two diffusion regions 208 (in FIG. 6 the right diffusion region 208, in FIG. 2 the diffusion region 208 on the left hand side) of a respective gate stack 212 is defined using a photoresist mask and or an auxiliary mask (such as, e.g., a hardmask, e.g., made of silicon oxide, silicon nitride or carbon). After having exposed the regions above the diffusion region 208, in which or above which the source contact should be formed, as shown in FIG. 6, the electrically conductive material 502 in the right first trench 406 of FIG. 6 is removed (e.g., etched, e.g., using a dry etching or wet etching process, e.g., using an anisotropic etching such as, e.g., a RIE process). Furthermore, the then exposed portion of the dielectric layer 206 within the right first trench 406 (in the following also referred to as source contact trench 406, portions of the substrate 202 material (e.g., silicon, including portions of the respective diffusion region 208) and portions of the shallow trench isolations 204 are removed to form a second trench 702, which extends through the respective diffusion region 208 into the substrate 202 material which is not highly doped (e.g., intrinsic semiconducting material or lightly doped semiconducting material). In an embodiment of the invention, the second trench 702 extends into the substrate 202 from the upper surface 704 from the substrate 202 by a depth d of, for example, about 50 nm to about 100 nm, e.g., by about 60 nm to about 90 nm, e.g., by about 75 nm.

Figure 8:
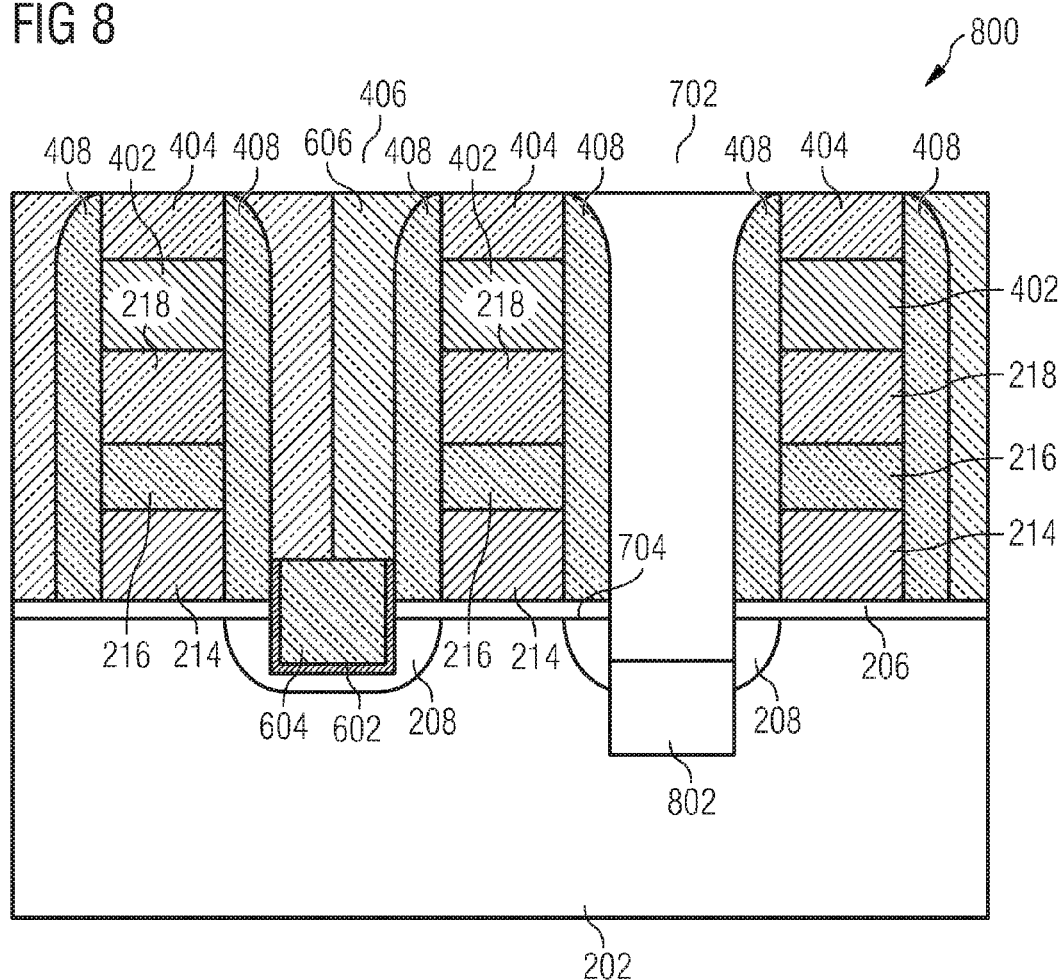
FIG. 8 shows a cross sectional view of the cell arrangement of FIG. 2 along the cross section A-A' in accordance with an embodiment of the invention at a fifth stage of its manufacture.

FIG. 8 shows a cross sectional view 800 of the cell arrangement of FIG. 2 along the cross section A-A' in accordance with an embodiment of the invention at a fifth stage of its manufacture.

In a following process, an oxide (e.g., silicon oxide) is deposited (e.g., using a CVD process or a PVD process or a thermal growth process) in the second trench 702 and the oxide is partially removed again (e.g., etched back, e.g., using an isotropic or anisotropic etching process, e.g., using a wet etching process or a dry etching process) to form a bottom isolation region 802 at the bottom of the second trench 702. The upper surface 804 of the bottom isolation region 802 is laterally seen within the remaining portions of the diffusion region, in other words, above the not highly doped substrate 202 region and below the upper surface 704 of the substrate 202. Illustratively, the bottom isolation region 802 forms a buried insulating structure.

Figure 9:
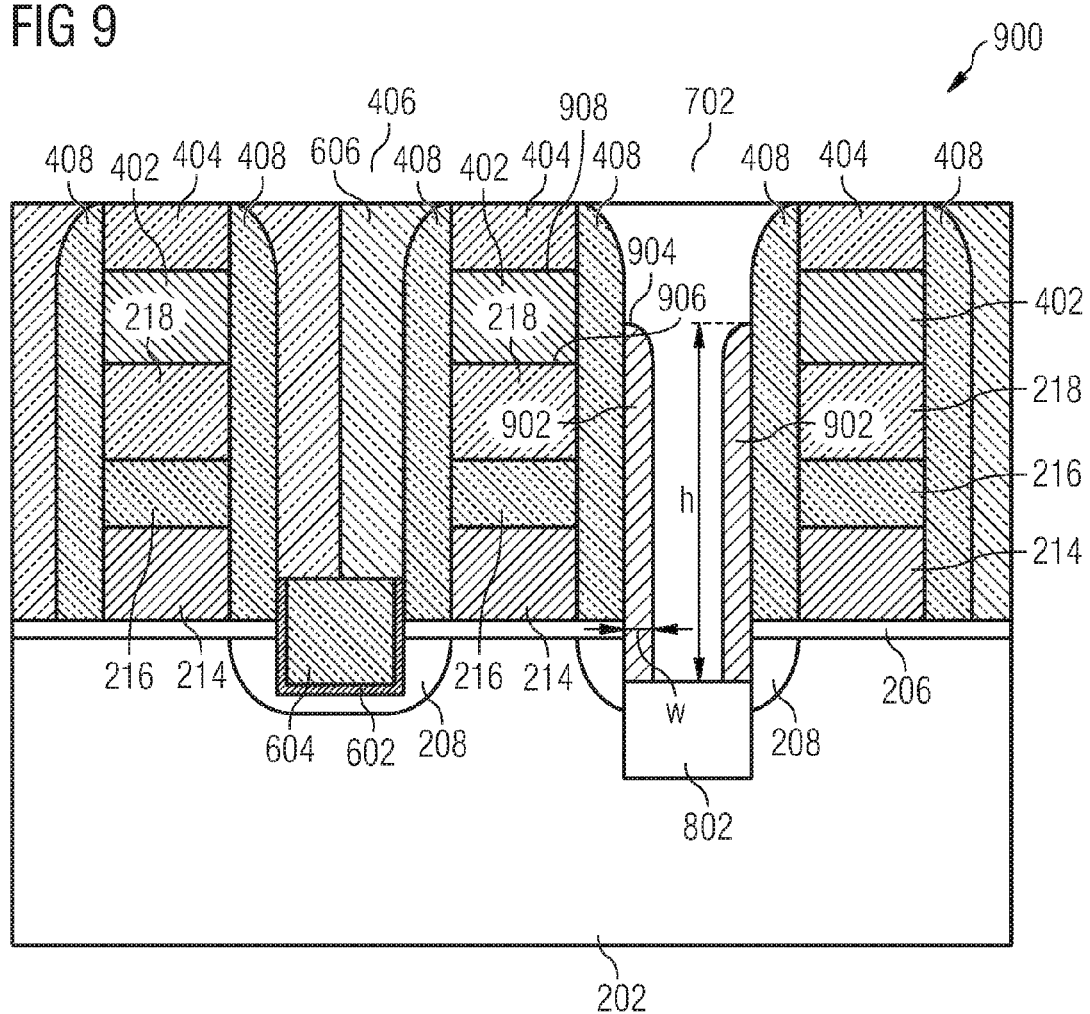
FIG. 9 shows a cross sectional view of the cell arrangement of FIG. 2 along the cross section A-A' in accordance with an embodiment of the invention at a sixth stage of its manufacture.

FIG. 9 shows a cross sectional view 900 of the cell arrangement of FIG. 2 along the cross section A-A' in accordance with an embodiment of the invention at a sixth stage of its manufacture.

Next, the second trench 702 is filled with electrically conductive material such as, e.g., polysilicon or any other suitable electrically conductive material, e.g., an electrically conductive material which may be deposited using a CVD process, e.g., a CVD depositable metal (e.g., tungsten silicide (WSi)). In an embodiment of the invention, the electrically conductive material is selected such that it is selectively removable (e.g., selectively etchable) with regard to the material used for the further dielectric layer 404 and the electrically insulating spacers 408, e.g., selectively removable (e.g., selectively etchable) with regard to a nitride (e.g., silicon nitride).

Then, using an anisotropic etching process (e.g., using a RIE process), for example, electrically conductive spacers 902 are formed within the second trench 702. The electrically conductive spacers 902 may be formed with a layer thickness w in the range from about 5 nm to about 20 nm, e.g., with a layer thickness w in the range from about 10 nm to about 15 nm, e.g., with a layer thickness w of about 12 nm. The height h of the electrically conductive spacers 902 may be selected such that the upper surface 904 of the electrically conductive spacers 902 may be in the lateral region of the third layer 402 of electrically conductive material, in other words, between the bottom surface 906 and the upper surface 908 of the third layer 402 of electrically conductive material.

Figure 10:
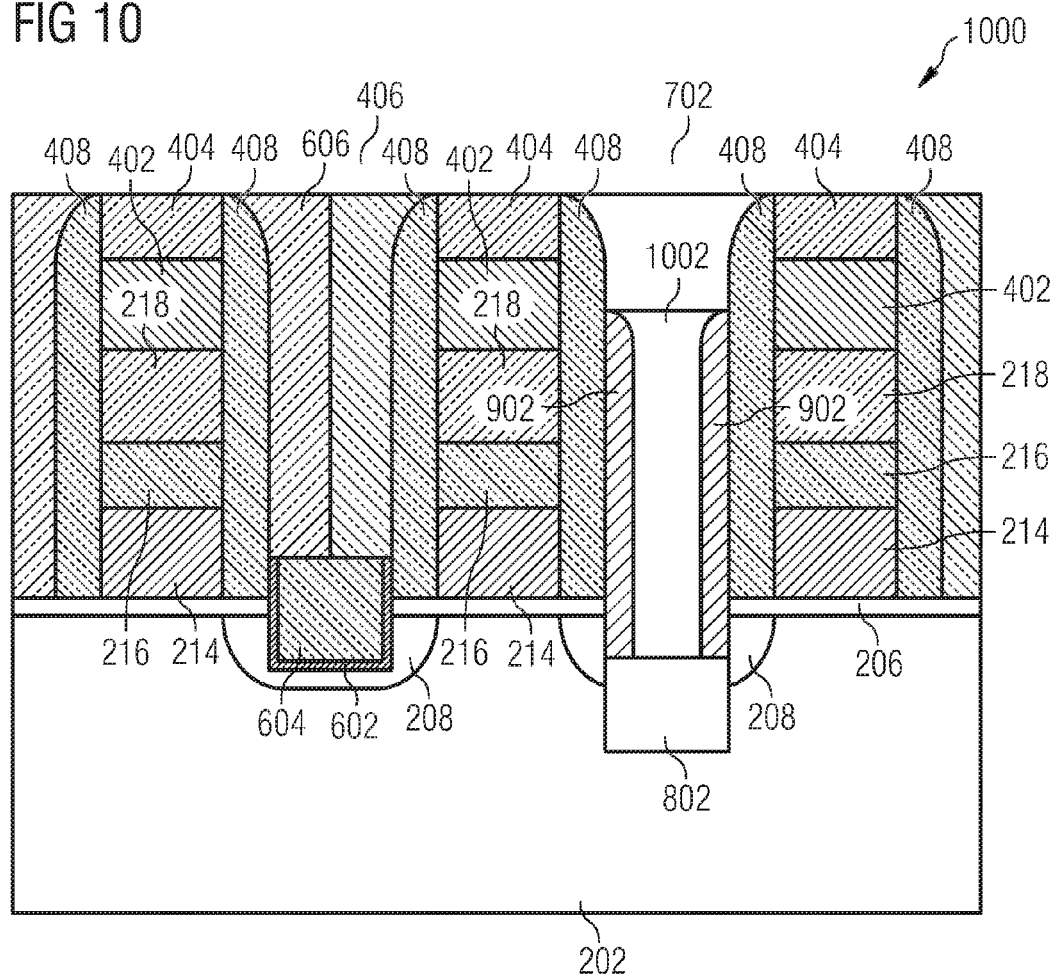
FIG. 10 shows a cross sectional view of the cell arrangement of FIG. 2 along the cross section A-A' in accordance with an embodiment of the invention at a seventh stage of its manufacture.

FIG. 10 shows a cross sectional view 1000 of the cell arrangement of FIG. 2 along the cross section A-A' in accordance with an embodiment of the invention at a seventh stage of its manufacture.

Then, using a line mask (which is oriented transverse with respect to the word lines), the electrically conductive spacers 902 are unpicked, in other words, separated or disconnected, thereby illustratively forming electrically conductive spacer posts of a width in direction of the word lines (perpendicular to the paper plane of FIG. 10) in the range from about 10 nm to about 30 nm, e.g., in the range from about 15 nm to about 25 nm, e.g., of about 20 nm. The electrically conductive spacer posts are then arranged in a distance from one another in direction of the word lines (perpendicular to the paper plane of FIG. 10) in the range from about 40 nm to about 80 nm, e.g., in the range from about 50 nm to about 70 nm, e.g., of about 60 nm. Then, the second trench 702 is filled and possible overfilled with another electrically insulating material (e.g., an oxide, e.g., silicon oxide), followed by a removal of the trench overfilling other electrically insulating material (e.g., by means of a CMP process) and a back etching of the other electrically insulating material down to a level that is level with the electrically conductive spacer posts, thereby forming an insulating structure 1002.

Figure 11:
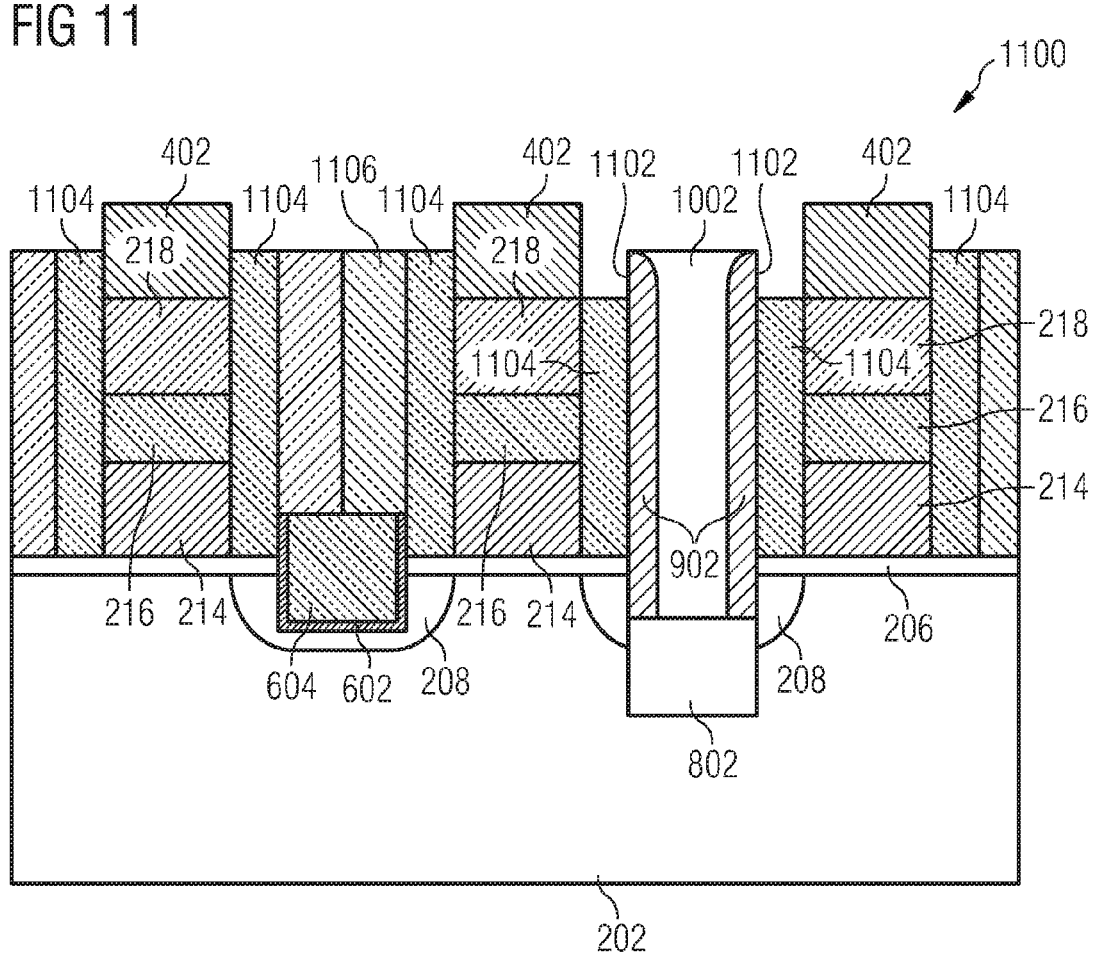
FIG. 11 shows a cross sectional view of the cell arrangement of FIG. 2 along the cross section A-A' in accordance with an embodiment of the invention at an eighth stage of its manufacture.

FIG. 11 shows a cross sectional view 1100 of the cell arrangement of FIG. 2 along the cross section A-A' in accordance with an embodiment of the invention at an eighth stage of its manufacture.

In an embodiment of the invention, the further dielectric layer 404, portions of the electrically insulating spacers (e.g., nitride spacers) 408 and portions of the other electrically insulating material 606 (e.g., a nitride, e.g., silicon nitride) are removed selectively with regard to the material of the third layer 402 of electrically conductive material is deposited, e.g., made of polysilicon (doped or undoped), to the material of the electrically conductive spacers 902 (e.g., made of polysilicon (doped or undoped)) and to the material of the insulating structure 1002 (e.g., an oxide, e.g., silicon oxide). In an embodiment of the invention, the nitride, e.g., silicon nitride, of which the above structures, namely the further dielectric layer 404, the electrically insulating spacers 408 and the other electrically insulating material 606, may be formed is selectively partially removed (e.g., selectively etched, e.g., using an isotropic etching process, e.g., a wet etching process, in an alternative embodiment of the invention, using an anisotropic etching process, e.g., a dry etching process, e.g., a RIE process) with regard to polysilicon and the used oxide (e.g., silicon oxide). Thus, in an embodiment of the invention, sidewall portions 1102 of the electrically conductive spacers 902 are exposed and recessed electrically insulating spacers 1104 and recessed other electrically insulating material 1106 are formed. In an embodiment of the invention, the etching process is stopped on the upper surface of the material of the electrically conductive spacers 902 (e.g., made of polysilicon (doped or undoped)) and of the material of the insulating structure 1002 (e.g., an oxide, e.g., silicon oxide). Illustratively, by exposing the sidewall portions 1102 of the electrically conductive spacers 902, is a part of a preparation of an electrically conductive connection to be formed between the resistivity changing layer structure to be formed (which will be described in more detail below) and the diffusion region 208 and thus, e.g., to the mass potential. The exposed sidewall portions 1102 of the electrically conductive spacers 902 may have a height in the range from about 5 nm to about 30 nm, e.g., a height in the range from about 10 nm to about 20 nm, e.g., a height of about 15 nm.

Figure 12:
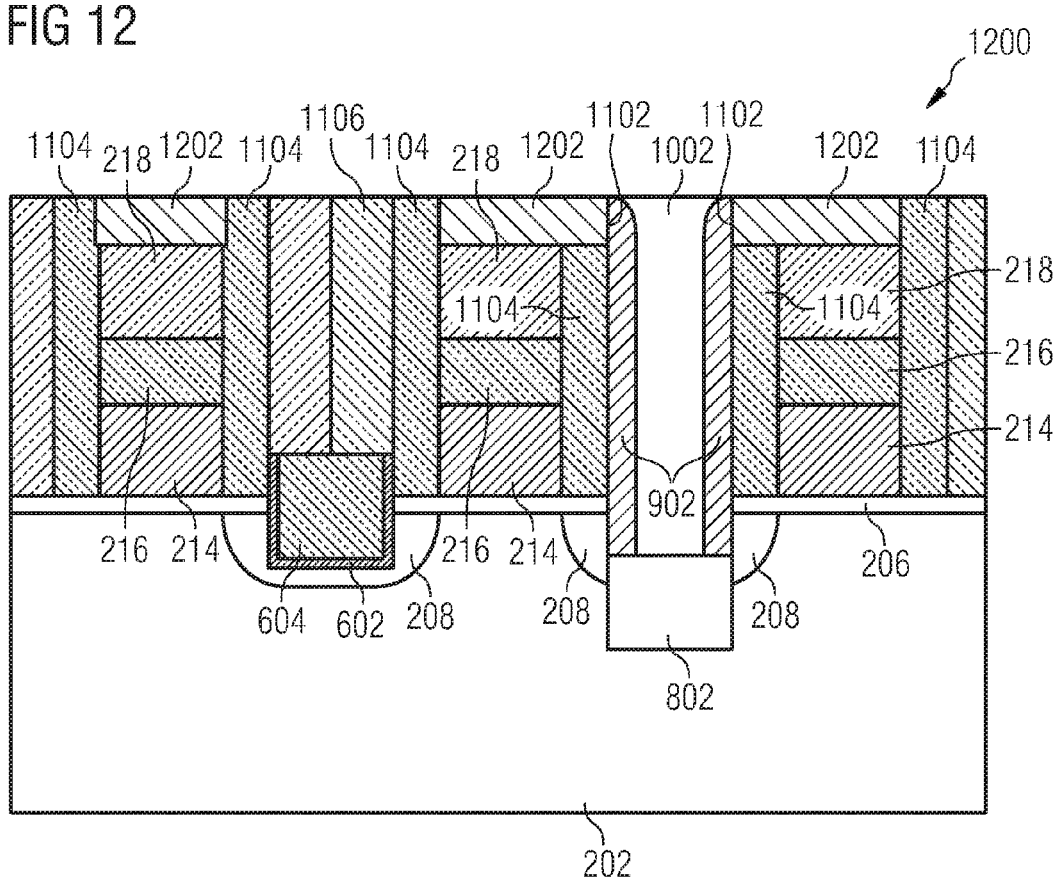
FIG. 12 shows a cross sectional view of the cell arrangement of FIG. 2 along the cross section A-A' in accordance with an embodiment of the invention at a ninth stage of its manufacture.

FIG. 12 shows a cross sectional view 1200 of the cell arrangement of FIG. 2 along the cross section A-A' in accordance with an embodiment of the invention at a ninth stage of its manufacture.

Furthermore, the third layer 402 of electrically conductive material is removed, e.g., by means of an anisotropic etching process, e.g., by means of a dry etching process (e.g., by means of a RIE process) and another electrically conductive material 1202 (e.g., polysilicon, e.g., doped polysilicon) is again deposited on the exposed upper surface of the second dielectric layer 218, followed by a planarization process (e.g., a CMP process) to planarize the deposited electrically conductive material to form a pre-stage of the first resistivity changing layer structure layer 220. In an embodiment of the invention, instead of polysilicon, any other electrically conductive material may be used, e.g., a metal, e.g., silver, copper or tungsten.

In yet another embodiment of the invention, the third layer 402 of electrically conductive material is only partially removed. In this embodiment, electrically conductive material (e.g., polysilicon or a metal, e.g., silver, copper or tungsten) is deposited to fill the gap between the third layer 402 of electrically conductive material and the electrically conductive spacers 902 to ensure an electrical ohmic contact between them. Then, a CMP process may be carried out to planarize the third layer 402 of electrically conductive material to the same level as the recessed electrically insulating spacers 1104 and the recessed other electrically insulating material 1106.

Figure 13:
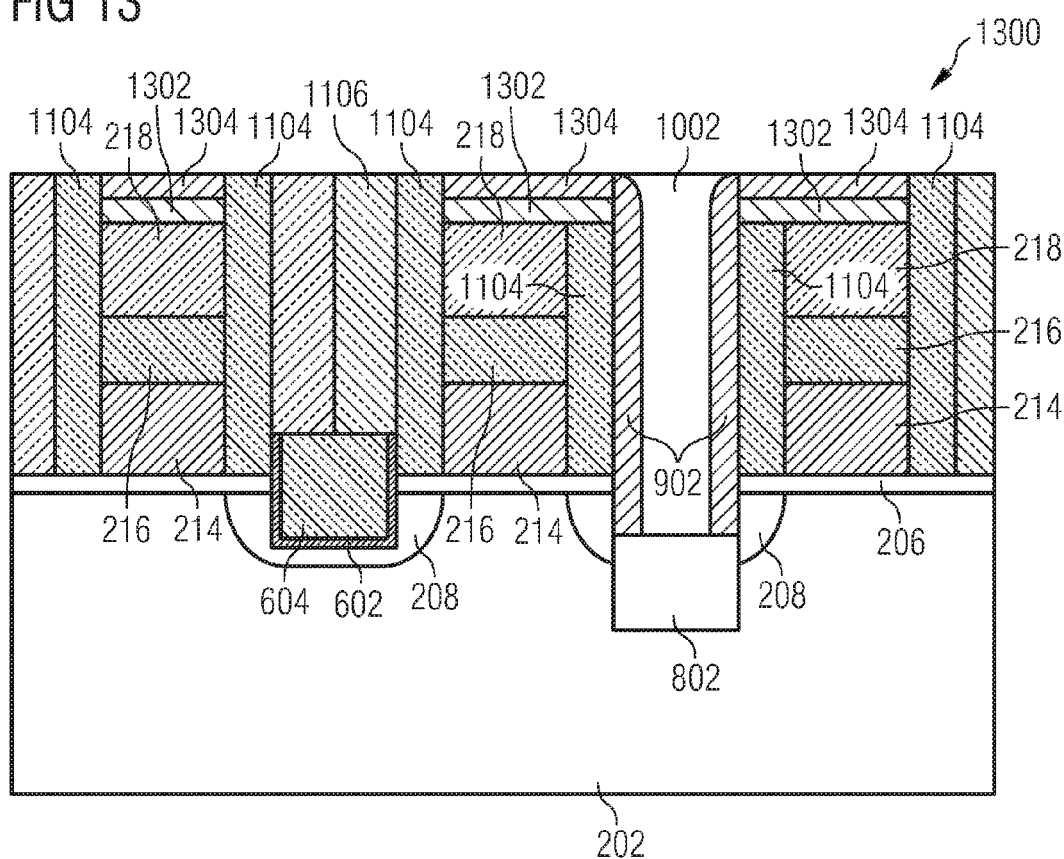
FIG. 13 shows a cross sectional view of the cell arrangement of FIG. 2 along the cross section A-A' in accordance with an embodiment of the invention at a tenth stage of its manufacture.

FIG. 13 shows a cross sectional view 1300 of the cell arrangement of FIG. 2 along the cross section A-A' in accordance with an embodiment of the invention at a tenth stage of its manufacture.

In an embodiment of the invention, the other electrically conductive material 1202 is partially removed, thereby forming a recessed electrically conductive region 1302, which, in one embodiment of the invention, forms the first resistivity changing layer structure layer 220. Next, a resistivity changing layer 1304 (which may be the resistivity changing layer 222 of FIG. 2) is deposited, e.g., using a CVD process or a PVD process. Then, the deposited resistivity changing layer may be planarized, e.g., using a CMP process, with stop on the upper surface of the recessed electrically insulating spacers 1104 and the recessed other electrically insulating material 1106. As described above, the resistivity changing layer 1304 may be made of a transition metal oxide or a solid state electrolyte or any other suitable material, for example, a material as described above. In an alternative embodiment of the invention, only exactly one layer may be provided in the resistivity changing layer structure 220, or three, four or even more layers.

By providing a planar structure, wherein the resistivity changing layer structure 220 may be deposited on or above the gate stacks and not next to the gate stacks, the cell dimension may be reduced. Furthermore, the materials used for the resistivity changing layer structure may be selected in a very flexible way. Thus, many different materials and thus many differents types of cells, e.g., many different types of memory cells, e.g., the above mentioned types of memory cells, may be manufactured in accordance with various embodiments of the invention.

Figure 14:
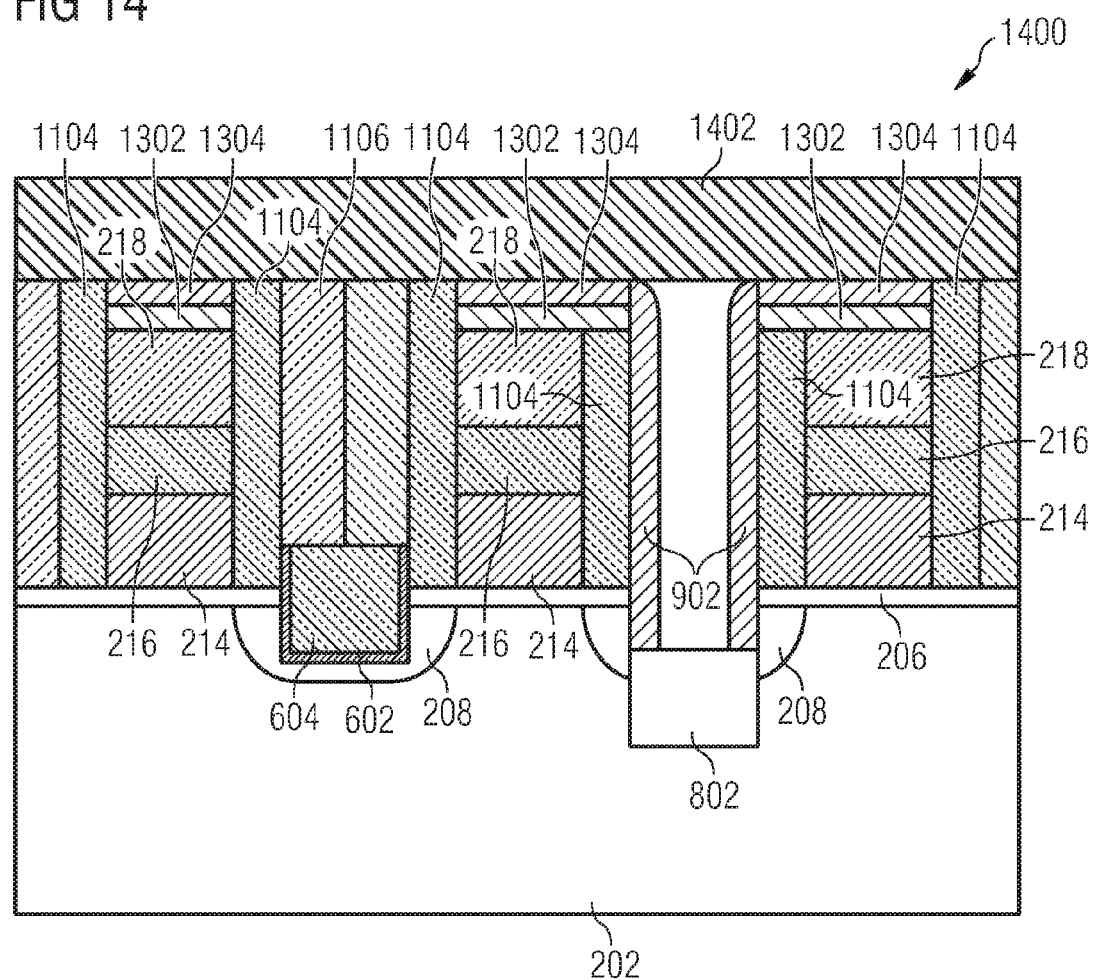
FIG. 14 shows a cross sectional view of the cell arrangement of FIG. 2 along the cross section A-A' in accordance with an embodiment of the invention at an eleventh stage of its manufacture.

FIG. 14 shows a cross sectional view 1400 of the cell arrangement of FIG. 2 along the cross section A-A' in accordance with an embodiment of the invention at an eleventh stage of its manufacture.

Then, in an embodiment of the invention, a metal, which may form the material of the bit lines 1402 to be formed is deposited on the upper surface of the structure 1300 shown in FIG. 13. In an embodiment of the invention, the metal may be copper or aluminum or any other suitable metal that may be used for the bit lines 1402. Next, using a photolithographic process, the bit lines 1402 are defined and then, using a corresponding mask, the bit lines are formed by removing portions of the resistivity changing layer structure (e.g., portions of the recessed electrically conductive region 1302 and the resistivity changing layer 1304 that are exposed by the mask), e.g., by means of an etching process, e.g., an ansisotropic etching process, e.g., a RIE process. Thus, the bit lines 1402 of the cell arrangement to be formed are manufactured.

Figure 15:
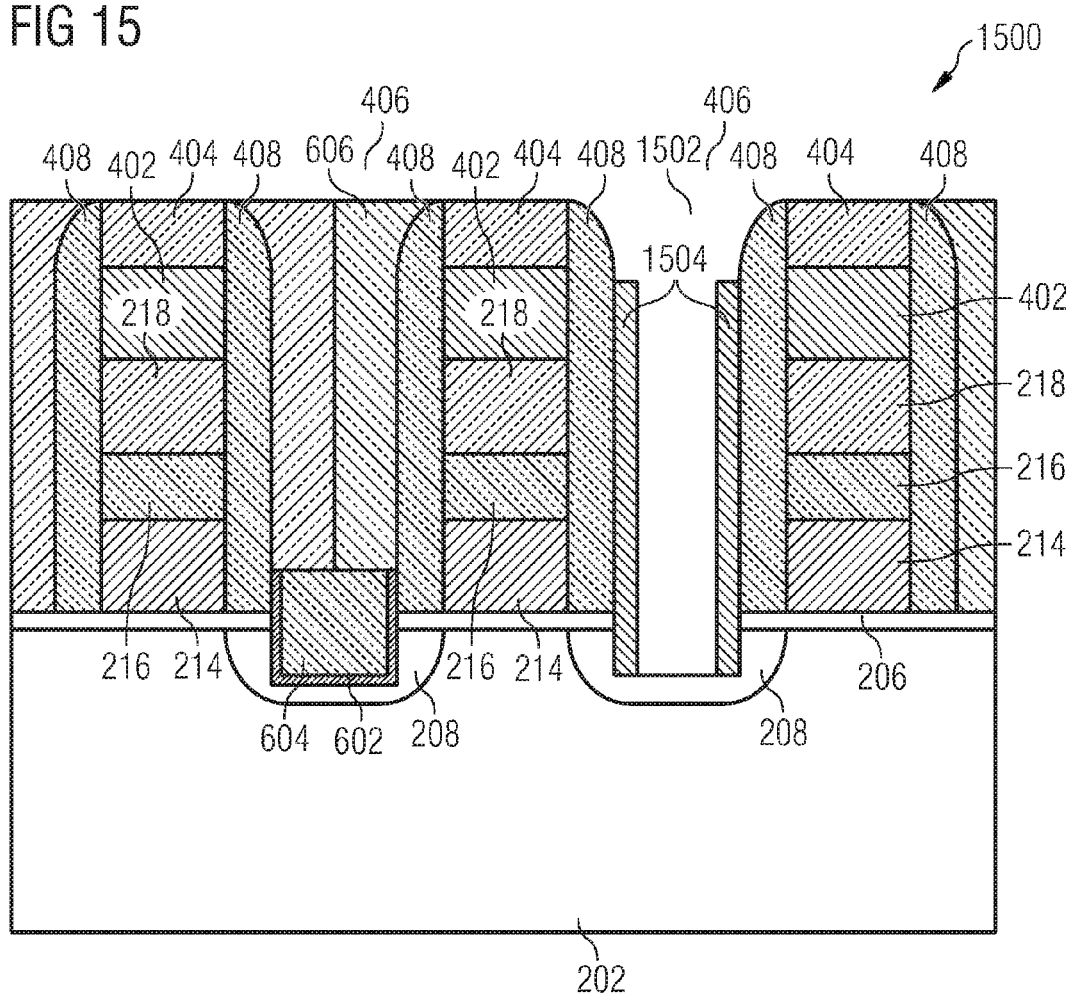
FIG. 15 shows a cross sectional view of the cell arrangement of FIG. 2 along the cross section A-A' in accordance with an alternative embodiment of the invention at a fourth stage of its manufacture.

FIG. 15 shows a cross sectional view 1500 of the cell arrangement of FIG. 2 along the cross section A-A' in accordance with an alternative embodiment of the invention at a fourth stage of its manufacture.

In accordance with this embodiment of the invention, using a photolithographic process, the structure of a source contact within and above the other one of the respective two diffusion regions 208 (in FIG. 6 the right diffusion region 208, in FIG. 2 the diffusion region 208 on the left hand side) of a respective gate stack 212 is defined using a photoresist mask and or an auxiliary mask (such as, e.g., a hardmask, e.g., made of silicon oxide, silicon nitride or carbon). After having exposed the regions above the diffusion region 208, in which or above which the source contact should be formed, as shown in FIG. 6, the electrically conductive material 502 in the right first trench 406 of FIG. 6 is removed (e.g., etched, e.g., using a dry etching or wet etching process, e.g., using an anisotropic etching such as, e.g., a RIE process). Furthermore, the then exposed portion of the dielectric layer 206 within the right first trench 406 (in the following also referred to as source contact trench 406 and portions of the respective diffusion region 208 are removed with stop within the diffusion region 208 and before exposing not highly doped substrate 202 material (e.g., intrinsic semiconducting material or lightly doped semiconducting material). In other words, the etching process is stopped within the highly doped junction and the thus formed second trench 1502 extends into the highly doped junction. Then, electrically insulating material (e.g., an oxide, e.g., silicon oxide) is deposited at least in the second trench 1502, followed by an anisotropic etching process (e.g., a RIE process), thereby forming further insulating spacers 1504.

Figure 16:
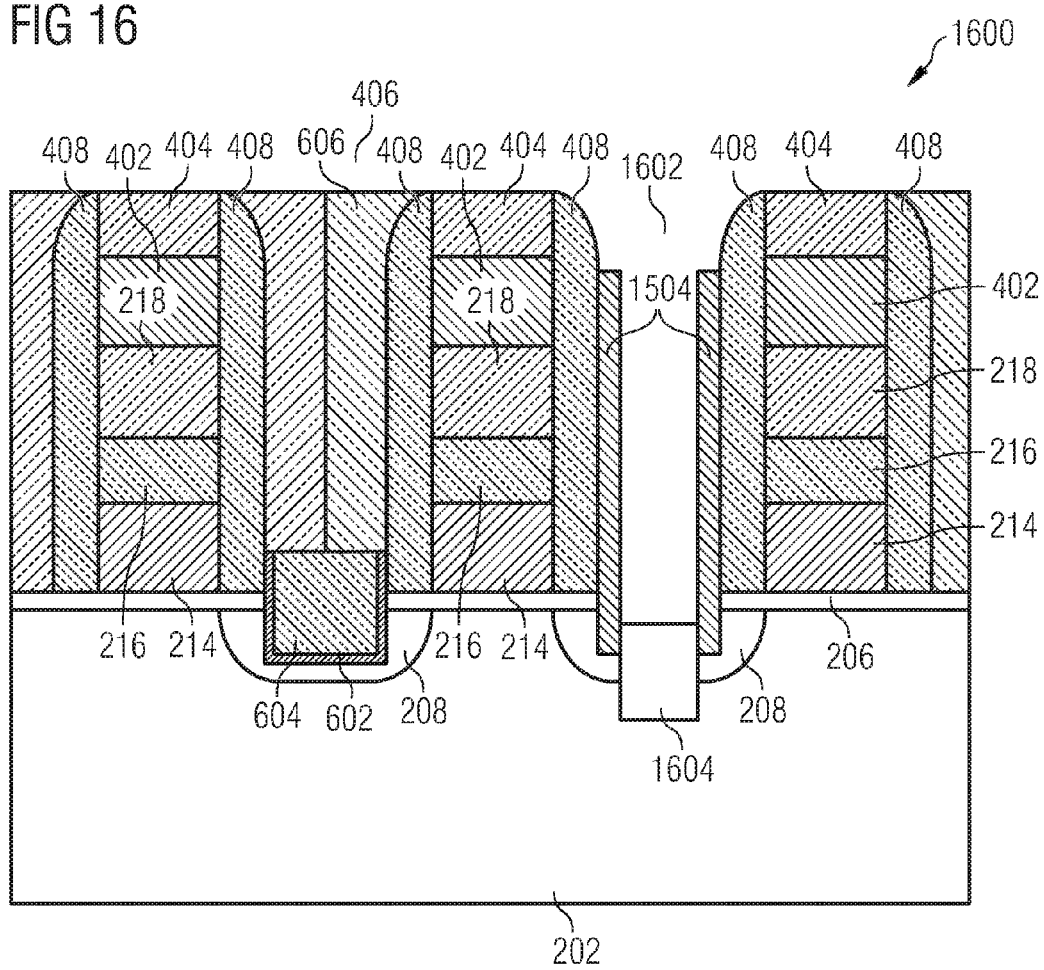
FIG. 16 shows a cross sectional view of the cell arrangement of FIG. 2 along the cross section A-A' in accordance with an alternative embodiment of the invention at a fifth stage of its manufacture.

FIG. 16 shows a cross sectional view 1600 of the cell arrangement of FIG. 2 along the cross section A-A' in accordance with an alternative embodiment of the invention at a fifth stage of its manufacture.

In an embodiment of the invention, the anisotropic etching process (e.g., the RIE process) is continued such that a third trench 1602 is formed which extends into the substrate 202 material which is not highly doped (e.g., intrinsic semiconducting material or lightly doped semiconducting material). In an embodiment of the invention, the third trench 1602 extends into the substrate 202 from the upper surface from the substrate 202 by a depth d of for example about 50 nm to about 100 nm, e.g., by about 60 nm to about 90 nm, e.g., by about 75 nm. Then, an electrically insulating material is selectively deposited beginning from the bottom of the third trench 1602. In an embodiment of the invention, a selective oxide deposition is provided, thereby forming a bottom insulating region 1604.

Figure 17:
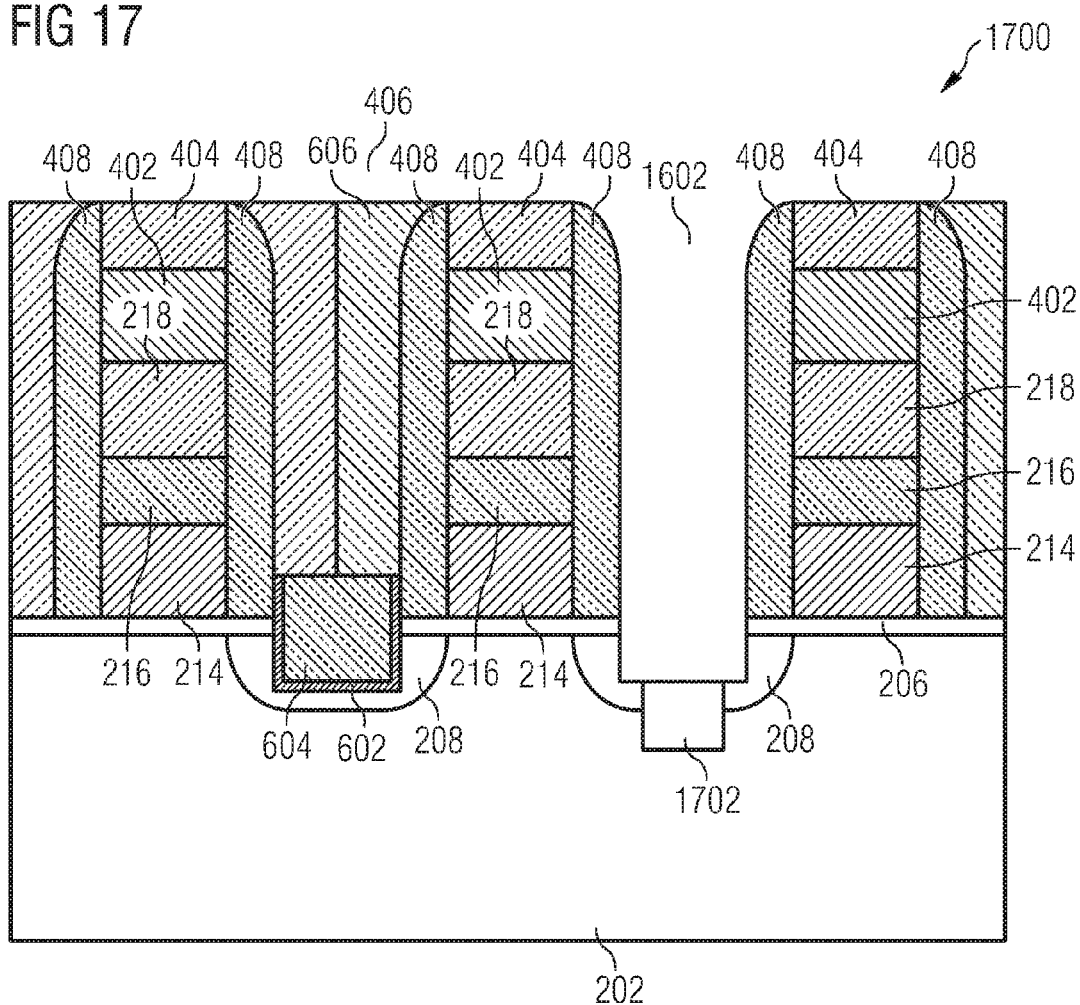
FIG. 17 shows a cross sectional view of the cell arrangement of FIG. 2 along the cross section A-A' in accordance with an alternative embodiment of the invention at a sixth stage of its manufacture.

FIG. 17 shows a cross sectional view 1700 of the cell arrangement of FIG. 2 along the cross section A-A' in accordance with an alternative embodiment of the invention at a sixth stage of its manufacture.

Then, the further insulating spacers 1504 are removed, e.g., using an etching process, e.g., a wet etching process, thereby also recessing a portion of the bottom insulating region 1604. Thus, a recessed bottom insulating region 1702 is formed.

Figure 18:
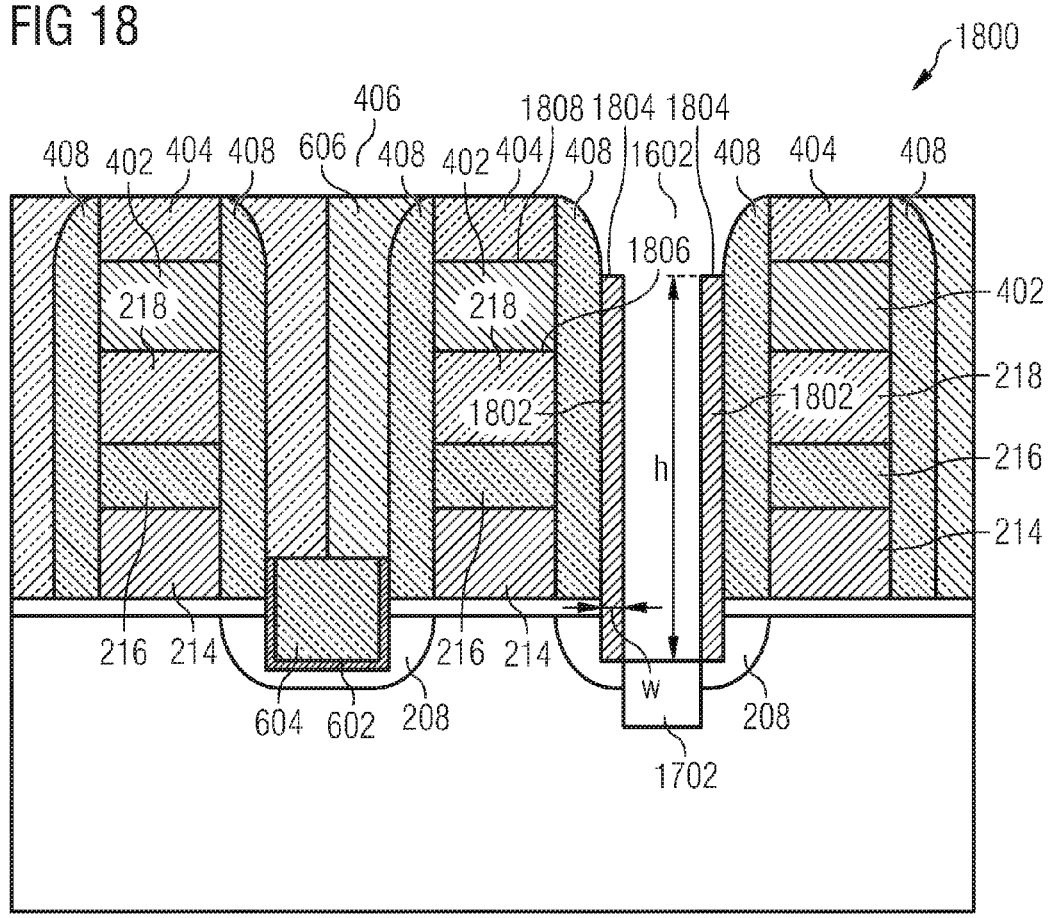
FIG. 18 shows a cross sectional view of the cell arrangement of FIG. 2 along the cross section A-A' in accordance with an alternative embodiment of the invention at a seventh stage of its manufacture.

FIG. 18 shows a cross sectional view 1800 of the cell arrangement of FIG. 2 along the cross section A-A' in accordance with an alternative embodiment of the invention at a seventh stage of its manufacture.

Next, the third trench 1602 is filled with electrically conductive material such as, e.g., polysilicon or any other suitable electrically conductive material, e.g., an electrically conductive material which may be deposited using a CVD process, e.g., a CVD depositable metal (e.g., tungsten silicide (WSi)). In an embodiment of the invention, the electrically conductive material is selected such that it is selectively removable (e.g., selectively etchable) with regard to the material used for the further dielectric layer 404 and the electrically insulating spacers 408, e.g., selectively removable (e.g., selectively etchable) with regard to a nitride (e.g., silicon nitride).

Then, using an anisotropic etching process (e.g., using a RIE process), for example, electrically conductive spacers 1802 (in the following also referred to using the reference number 902) are formed within the third trench 1602. The electrically conductive spacers 1802 may be formed with a layer thickness w in the range from about 5 nm to about 20 nm, e.g., with a layer thickness w in the range from about 10 nm to about 15 nm, e.g., with a layer thickness w of about 12 nm. The height h of the electrically conductive spacers 1802 may be selected such that the upper surface 1804 of the electrically conductive spacers 1802 may be in the lateral region of the third layer 402 of electrically conductive material, in other words, between the bottom surface 1806 and the upper surface 1808 of the third layer 402 of electrically conductive material.

Then, the manufacturing process is similar to the first embodiments and therefore, reference is made to the FIGS. 10 to 14 and the corresponding description above.

Various embodiments of the invention provide a resistive memory cell, e.g., a 1T1R (1 transistor and 1 resistor) type memory cell with a small foot print.

By way of example, in various embodiments of the invention, a manufacturing scheme is provided that utilizes
various self-aligned features;
horizontal type resistive elements;
a small bit line as well as word line pitch that allows to obtain a memory cell that is smaller than 6F$^2$ (F denotes the minimum feature size of a respective manufacturing process).

In an embodiment of the invention, a cell concept is provided for resistive memories which has a planar arrangement of the resistive element combined with buried strap type contacts to source/drain junctions of the address device.

Figure 19A:
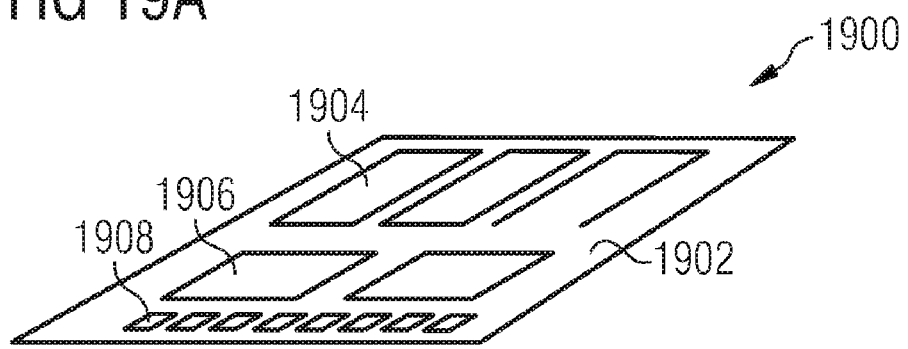
FIGS. 19A and 19B show a memory module (FIG. 19A) and a stackable memory module (FIG. 19B) in accordance with an embodiment of the invention.
Figure 19B:
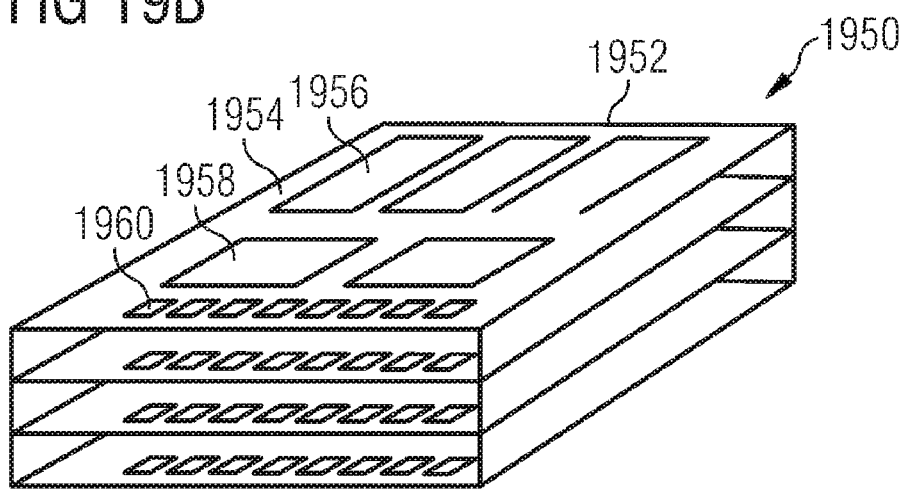

As shown in FIGS. 19A and 19B, in some embodiments, memory devices such as those described herein may be used in modules.

In FIG. 19A, a memory module 1900 is shown, on which one or more memory devices 1904 are arranged on a substrate 1902. The memory device 1904 may include numerous memory cells, each of which uses a memory element in accordance with an embodiment of the invention. The memory module 1900 may also include one or more electronic devices 1906, which may include memory, processing circuitry, control circuitry, addressing circuitry, bus interconnection circuitry, or other circuitry or electronic devices that may be combined on a module with a memory device, such as the memory device 1904. Additionally, the memory module 1900 includes multiple electrical connections 1908, which may be used to connect the memory module 1900 to other electronic components, including other modules.

As shown in FIG. 19B, in some embodiments, these modules may be stackable, to form a stack 1950. For example, a stackable memory module 1952 may contain one or more memory devices 1956, arranged on a stackable substrate 1954. The memory device 1956 contains memory cells that employ memory elements in accordance with an embodiment of the invention. The stackable memory module 1952 may also include one or more electronic devices 1958, which may include memory, processing circuitry, control circuitry, addressing circuitry, bus interconnection circuitry, or other circuitry or electronic devices that may be combined on a module with a memory device, such as the memory device 1956. Electrical connections 1960 are used to connect the stackable memory module 1952 with other modules in the stack 1950, or with other electronic devices. Other modules in the stack 1950 may include additional stackable memory modules, similar to the stackable memory module 1952 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
a first source/drain region;
a second source/drain region;
an active region between the first source/drain region and the second source/drain region;
a gate stack disposed above the active region;
a resistivity changing layer structure disposed above the gate stack, wherein the resistivity changing layer structure comprises a resistivity changing layer, wherein the resistivity changing layer comprises a resistivity changing material; and
an electrically conductive layer disposed above the resistivity changing layer, wherein the electrically conductive layer is electrically coupled to the resistivity changing layer.

2. The integrated circuit of claim 1, wherein the first and second source/drain regions are source/drain regions of a memory cell.

3. The integrated circuit of claim 1, further comprising an electrically conductive connecting structure next to the gate stack to electrically connect the resistivity changing layer with the first source/drain region or the second source/drain region.

4. The integrated circuit of claim 3, wherein the electrically conductive connecting structure comprises at least one electrically conductive spacer disposed next to the gate stack.

5. The integrated circuit of claim 3, wherein the electrically conductive connecting structure comprises a material formed using a vapor deposition process.

6. The integrated circuit of claim 3, wherein the electrically conductive connecting structure comprises polysilicon or tungsten silicide.

7. The integrated circuit of claim 3, wherein the gate stack comprises a plurality of layers being arranged above one another.

8. The integrated circuit of claim 7, wherein the gate stack comprises:
a first insulating layer disposed above the active region;
an electrically conductive gate region disposed above the first insulating layer; and
a second insulating layer disposed above the electrically conductive gate region.

9. The integrated circuit of claim 1, further comprising an electrode layer disposed above the gate stack, wherein the resistivity changing layer is disposed above the electrode layer.

10. An integrated circuit comprising:
a field effect transistor structure which comprises a gate stack;

a resistivity changing material structure disposed above the gate stack, wherein the resistivity changing material structure comprises a resistivity changing material which is configured to change its resistivity in response to an application of an electrical voltage to the resistivity changing material structure; and an electrically conductive layer disposed above the resistivity changing material structure, wherein the electrically conductive layer is electrically coupled to the resistivity changing material structure.

11. The integrated circuit of claim 10, wherein the field effect transistor structure comprises a part of a memory cell.

12. The integrated circuit of claim 10, further comprising an electrically conductive connecting structure next to the gate stack to electrically connect a resistivity changing layer with a source/drain region of the field effect transistor structure.

13. The integrated circuit of claim 12, wherein the electrically conductive connecting structure comprises at least one electrically conductive spacer disposed next to the gate stack.

14. The integrated circuit of claim 12, wherein the electrically conductive connecting structure comprises a material formed using a vapor deposition process.

15. The integrated circuit of claim 12, wherein the electrically conductive connecting structure comprises polysilicon or tungsten silicide.

16. The integrated circuit of claim 12, wherein the gate stack comprises a plurality of layers arranged above one another.

17. The integrated circuit of claim 16, wherein the gate stack comprises
a first insulating layer disposed above an active region;
an electrically conductive gate region disposed above the first insulating layer; and
a second insulating layer disposed above the electrically conductive gate region.

18. The integrated circuit of claim 10, further comprising an electrode layer disposed above the gate stack, wherein the resistivity changing layer is disposed above the electrode layer.

19. A memory module, comprising:
a plurality of integrated circuits, wherein at least one integrated circuit of the plurality of integrated circuits comprises a cell, the cell comprising:
a first source/drain region;
a second source/drain region;
an active region between the first source/drain region and the second source/drain region;
a gate stack disposed above the active region;
a resistivity changing layer structure disposed above the gate stack, wherein the resistivity changing layer structure comprises a resistivity changing layer, wherein the resistivity changing layer comprises a resistivity changing material; and
an electrically conductive layer disposed above the resistivity changing layer, wherein the electrically conductive layer is electrically coupled to the resistivity changing layer.

20. The memory module of claim 19, wherein the memory module is a stackable memory module in which at least some of the integrated circuits are stacked one above the other.

21. A memory module, comprising:
a plurality of integrated circuits, wherein at least one integrated circuit of the plurality of integrated circuits comprises a cell, the cell comprising:
a first source/drain region;
a second source/drain region;
an active region between the first source/drain region and the second source/drain region;
a gate stack disposed above the active region; and
a resistivity changing layer structure disposed above the gate stack, wherein the resistivity changing layer structure comprises a resistivity changing layer, wherein the resistivity changing layer comprises a resistivity changing material;
wherein the memory module is a stackable memory module in which at least some of the integrated circuits are stacked one above the other.

22. The memory module of claim 21, wherein the first and second source/drain regions are source/drain regions of a memory cell.

23. The memory module of claim 21, further comprising an electrically conductive connecting structure next to the gate stack to electrically connect the resistivity changing layer with the first source/drain region or the second source/drain region.

24. The memory module of claim 23, wherein the electrically conductive connecting structure comprises at least one electrically conductive spacer disposed next to the gate stack.

25. The memory module of claim 23, wherein the electrically conductive connecting structure comprises a material formed using a vapor deposition process.

26. The memory module of claim 23, wherein the electrically conductive connecting structure comprises polysilicon or tungsten silicide.

27. The memory module of claim 23, wherein the gate stack comprises a plurality of layers being arranged above one another.

28. The memory module of claim 27, wherein the gate stack comprises:
a first insulating layer disposed above the active region;
an electrically conductive gate region disposed above the first insulating layer; and
a second insulating layer disposed above the electrically conductive gate region.

29. The memory module of claim 21, further comprising an electrode layer disposed above the gate stack, wherein the resistivity changing layer is disposed above the electrode layer.

30. An integrated circuit comprising:
a first source/drain region;
a second source/drain region;
an active region between the first source/drain region and the second source/drain region;
a gate stack disposed above the active region;
a resistivity changing layer structure disposed above the gate stack, wherein the resistivity changing layer structure comprises a resistivity changing layer, wherein the resistivity changing layer comprises a resistivity changing material; and
an electrically conductive connecting structure next to the gate stack to electrically connect the resistivity changing layer with the first source/drain region or the second source/drain region, wherein the electrically conductive connecting structure comprises polysilicon or tungsten silicide.

* * * * *